US008123901B2

(12) United States Patent
Inada et al.

(10) Patent No.: US 8,123,901 B2
(45) Date of Patent: *Feb. 28, 2012

(54) ETCHING APPARATUS

(75) Inventors: Atsuro Inada, Kawasaki (JP); Kazuhiko Ueno, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 263 days.

This patent is subject to a terminal disclaimer.

(21) Appl. No.: 11/253,586

(22) Filed: Oct. 20, 2005

(65) Prior Publication Data

US 2006/0086462 A1    Apr. 27, 2006

(30) Foreign Application Priority Data

Oct. 21, 2004    (JP) ................. 2004-307393

(51) Int. Cl.
*H01L 21/68* (2006.01)
*H01L 21/306* (2006.01)
*B65D 85/86* (2006.01)

(52) U.S. Cl. .......... 156/345.24; 156/345.11; 156/345.23

(58) Field of Classification Search ............. 156/345.33, 156/345.24, 345.23, 345, 345.47, 345.11; 134/902, 50

See application file for complete search history.

(56) References Cited

U.S. PATENT DOCUMENTS

| 5,171,031 A * | 12/1992 | Nishiyama ................... 279/133 |
| 5,811,211 A * | 9/1998 | Tanaka et al. .................. 430/30 |
| 5,943,549 A * | 8/1999 | Motoura et al. ................. 438/7 |
| 6,012,192 A * | 1/2000 | Sawada et al. .................. 15/77 |
| 6,550,695 B1 * | 4/2003 | Trent ........................... 239/310 |
| 6,767,407 B2 * | 7/2004 | Yu et al. ....................... 118/728 |
| 2005/0034811 A1 * | 2/2005 | Mahoney et al. ......... 156/345.24 |
| 2006/0086461 A1 * | 4/2006 | Inada et al. .............. 156/345.33 |
| 2006/0086462 A1 * | 4/2006 | Inada et al. .............. 156/345.33 |
| 2009/0000549 A1 * | 1/2009 | Wang et al. ................... 118/712 |

FOREIGN PATENT DOCUMENTS

| JP | 07-142449 | 6/1995 |
| JP | 07142449 A * | 6/1995 |
| JP | 08-236419 | 9/1996 |
| JP | 08-279494 | 10/1996 |
| JP | 09-115893 | 5/1997 |
| JP | 09-283459 | 10/1997 |
| JP | 10-185535 | 7/1998 |
| JP | 11-016888 | 1/1999 |
| JP | 11-186234 | 7/1999 |
| JP | 2000-281172 | 10/2000 |

(Continued)

OTHER PUBLICATIONS

Computer generated English Translation of JP 07-142449. Published Jun. 2, 1995.*

(Continued)

*Primary Examiner* — Sylvia R. MacArthur
(74) *Attorney, Agent, or Firm* — Young & Thompson

(57) ABSTRACT

The wafer processing apparatus 100 included in an etching apparatus selectively etches the peripheral portion of a wafer 200. The wafer processing apparatus 100 includes a lower electrode 112 as a stage on which the wafer 200 is placed, a process gas introducing duct 120 supplying therethgouh a process gas etching the peripheral portion, an etching-interfering gas introducing duct 118 supplying therethrough an etching-interfering gas interfering supply of the process gas to the center portion of the wafer, and a movable alignment mechanism 102 aligning the wafer on the lower electrode 112. The etching-interfering gas introducing duct 118 and the process gas introducing duct 120 can be provided in an upper electrode 106.

19 Claims, 18 Drawing Sheets

FOREIGN PATENT DOCUMENTS

| | | |
|---|---|---|
| JP | 2001-135712 | 5/2001 |
| JP | 2001156039 A * | 6/2001 |
| KR | 2003-0001624 | 1/2003 |

OTHER PUBLICATIONS

Computer generated English Translation of JP 2001-156039. Published Jun. 8, 2001.*

Computer generated English Translation KR 1020030001624. Published Jan. 8, 2003.*

Machine generated translation of JP 2000-281172 published Oct. 10, 2000.*

Japanese Patent Office issued a Japanese Office Action dated Apr. 28, 2009, Application No. 2004-307393.

* cited by examiner

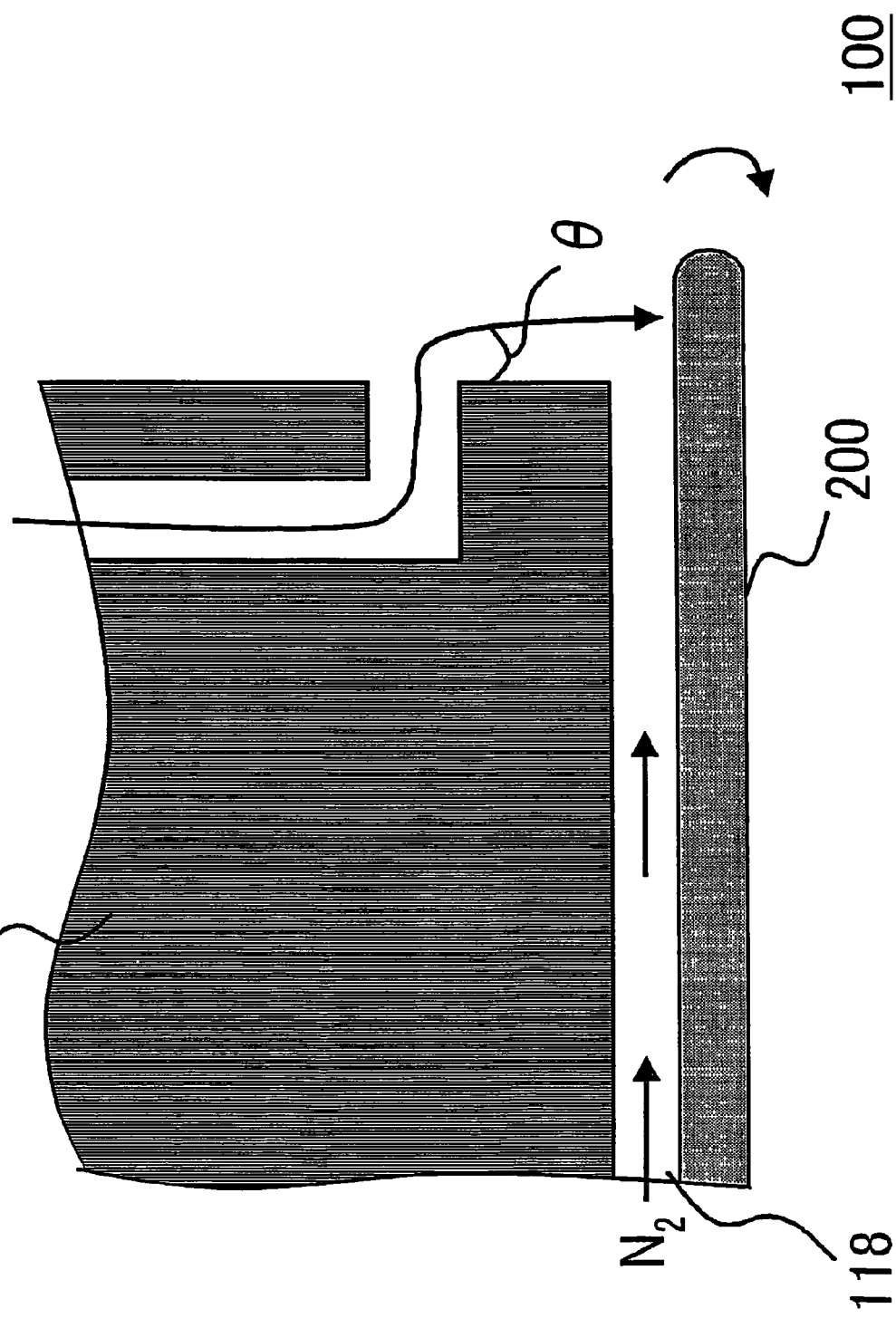

FIG. 18

WIDTH OF REMOVAL OF WAFER PERIPHERY (mm)

| POSITION | a | a' | b | b' |
|---|---|---|---|---|
| EXAMPLE 1 | 1 | 1 | 1 | 1 |
| EXAMPLE 2 | 1.5 | 0.5 | 1.3 | 0.7 |

ETCHING APPARATUS

This application is based on Japanese patent application No. 2004-307393 the content of which is incorporated hereinto by reference.

BACKGROUND

1. Technical Field

The present invention relates to an etching apparatus, and in particular to an etching apparatus selectively etching the peripheral portion of the wafer.

2. Related Art

In fabrication process of semiconductor devices, it is necessary to remove metal or other contaminants adhered to the peripheral portion of wafers, in order to avoid spreading of particles or metal contaminants towards elements formed at the center portion of the wafers.

Japanese Laid-Open Patent Publication No. H7-142449 discloses a technique of limiting discharge planes of upper and lower electrodes of a plasma etching apparatus corresponding to the circumferential surface of the wafer to be etched, and at the same time by blowing an inert gas onto the inner portion of the wafer surface which should not be etched. It is described in this publication that this makes it possible to selectively etch only the circumferential surface of the wafer.

Japanese Laid-Open Patent Publication No. 2001-135712 discloses a vacuum processing apparatus comprising a vacuum chamber in which a wafer is vacuum-processed, a stage disposed in the vacuum chamber and on which the wafer is placed, a plurality of lift-off pins allowed to have a state of being housed in the stage and have a state of being projected upward from the surface of the stage, having an inclined portion inclined so as to allow the upper portion thereof to open outwardly, and a gas blow-out unit blowing a gas upwardly out from the surface of the stage so as to make the wafer float.

Japanese Laid-Open Patent Publication No. H11-186234 discloses an etching apparatus used for plasma-assisted anisotropic etching, configured having a cover provided on a lower electrode so as to cover the region other than a region in which a base is placed, and pressing units pressing the cover onto four divided side faces of the base. The publication describes that the configuration can reduce difference in surface potential between the base and the cover, and can thereby improve uniformity in etching rate of the base.

A problem may, however, arise in that the center of the wafer is misaligned when the wafer is transferred into a processing apparatus, due to a limited accuracy of the transfer system. Any misalignment of the center of the wafer during the etching of the peripheral portion thereof may result in non-uniformity in the width of removal of the peripheral portion, showing a larger width of removal on one side and a smaller width of removal on the other side. It is therefore anticipated that setting of a larger margin for the width of removal of the peripheral portion may result in an etching excessively proceeds into the central area for element formation. On the other hand, setting of a smaller margin for the width of removal so as to avoid excessive etching of the central area for element formation may result in only an insufficient removal of contaminants and so forth in the peripheral portion.

In the etching apparatus selectively etching the peripheral portion of a wafer, stability in the width of removal of the peripheral portion largely affects expansion of a guaranteed area in the peripheral portion. A larger guaranteed area in the peripheral portion can improve the number of obtainable effective semiconductor chips, and can thereby improve the productivity of the chips. It is therefore necessary to improve the stability in the width of removal of the peripheral portion in the peripheral etching.

None of the conventional etching apparatus selectively etching the peripheral portion of the wafer, however, has any mechanism of correcting displacement of the wafer in the reaction chamber. The displacement of the wafer, therefore, directly results in variation in the width of removal of the peripheral portion, and prevents expansion of the guaranteed region in the peripheral portion.

SUMMARY OF THE INVENTION

According to the present invention, there is provided an etching apparatus selectively etching the peripheral portion of a wafer. The etching apparatus includes: a stage on which a wafer is placed; an etchant supply port allowing through which an etchant etching the peripheral portion is supplied; an etching-interfering agent supply port through which an etching-interfering agent interfering supply of the etchant to the center of the wafer is supplied; and a movable alignment mechanism taking part in wafer alignment on the stage.

The etching apparatus herein may be configured as a dry etching apparatus. The etchant may be a process gas such as an etching gas, or an etching solution. The etching-interfering agent may be an etching-interfering gas or an etching-interfering liquid.

According to the present invention, the wafer can be aligned on the stage of the etching apparatus selectively etching the peripheral portion of the wafer, so that misalignment of the wafer can be corrected, and thereby the width of removal of the peripheral portion of the wafer can be made uniform. The mobility of the alignment mechanism makes it possible to retract the alignment mechanism after alignment apart from the wafer, and therefore makes it possible to uniformly etching the peripheral portion of the wafer.

The etching apparatus may further include an upper electrode and a lower electrode generating a plasma, and the stage may be configured as placing the wafer between the upper electrode and the lower electrode, and as having an in-plane width smaller than that of the wafer placed thereon. This allows the plasma to extend behind the back peripheral portion of the wafer, and makes it possible to remove any pollutants or films adhered on the back peripheral portion of the wafer.

When the plasma is partially generated, and the plasma generation region should fluctuate during etching only of the peripheral portion of the wafer, the peripheral removal region may vary. Whereas the present invention can correct the misalignment of the wafer, so that it is made possible to equalize the width of removal of the peripheral portion of the wafer, by aligning the wafer corresponding to fluctuation in the plasma generation region.

According to the present invention, the width of removal of the peripheral portion can stably be equalized in the etching apparatus selectively etching the peripheral portion of the wafer.

BRIEF DESCRIPTION OF THE DRAWINGS

The above and other objects, advantages and features of the present invention will be more apparent from the following description taken in conjunction with the accompanying drawings, in which:

FIG. 16 is a schematic drawing showing that the width of removal of the peripheral portion of the wafer can be adjusted by controlling the supply volume of the process gas in the embodiment;

FIG. 18 is a drawing showing results of Examples.

DETAILED DESCRIPTION

Figure 1:
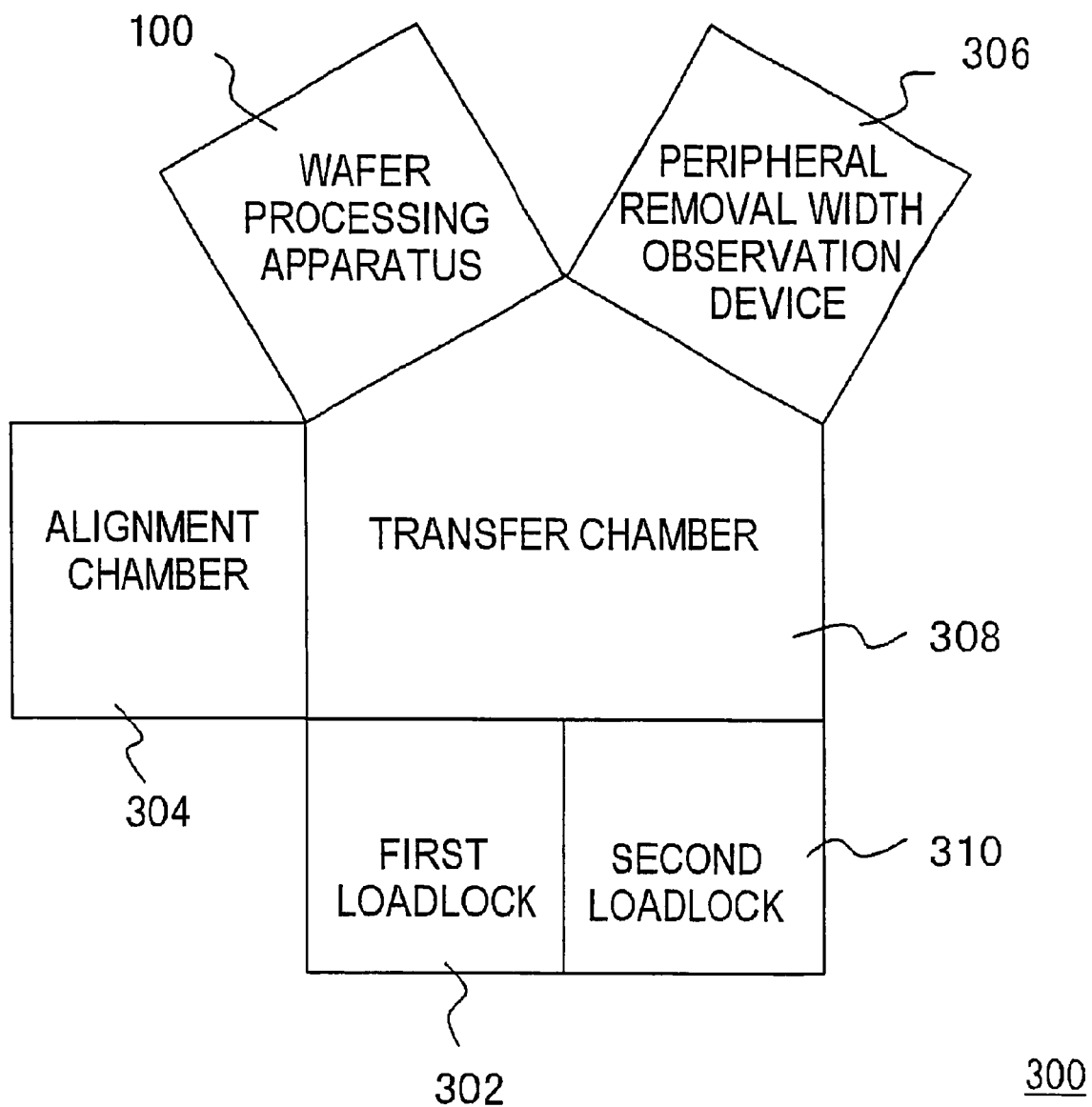
FIG. 1 is a drawing schematically showing a configuration of the etching apparatus in one embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The following paragraphs will describe embodiments of the present invention referring to the attached drawings. Any similar constituents appear in all drawings will be given with the same reference numerals, so as to occasionally allow omission of repetitive explanation.

In the embodiments of the present invention, the etching apparatus is used for selective etching the peripheral portion of a wafer. The explanation below will be made on a case where the etching apparatus is a dry etching apparatus. The etching apparatus includes a lower electrode as a stage on which a wafer is placed, a process gas introducing duct (etchant supply port) supplying a process gas (etchant) etching the peripheral portion, an etching-interfering gas introducing duct (etching-interfering agent supply port) supplying an etching-interfering gas (etching-interfering agent) interfering supply of the process gas to the center portion of the wafer, and a movable alignment mechanism aligning the wafer on the stage. The etching-interfering gas introducing duct and the process gas introducing duct can be provided in an upper electrode.

First Embodiment

FIG. 1 is a drawing schematically showing a configuration of an etching apparatus of a first embodiment.

The etching apparatus 300 of the first embodiment is intended for plasma etching of the peripheral portion of a wafer. The etching apparatus 300 includes a wafer processing apparatus 100, a first loadlock 302, an alignment chamber 304, a peripheral removal width observation unit 306, a transfer chamber 308, and a second loadlock 310. These constituents are integrated in an all-in-one manner. A wafer is transferred via the transfer chamber 308, from the first loadlock 302 or the second loadlock 310, and among the alignment chamber 304, the wafer processing apparatus 100 and the peripheral removal width observation unit 306, and again to the first loadlock 302 or the second loadlock 310.

The peripheral removal width observation unit 306 is typically configured as an optical microscope discriminating an etched region from the other region based on the contrast therebetween. The peripheral removal width observation unit 306 may be configured also as a step profiler or a film thickness analyzer, for example, discriminating the etched region from the other region based on difference in the film thickness.

Figure 2:
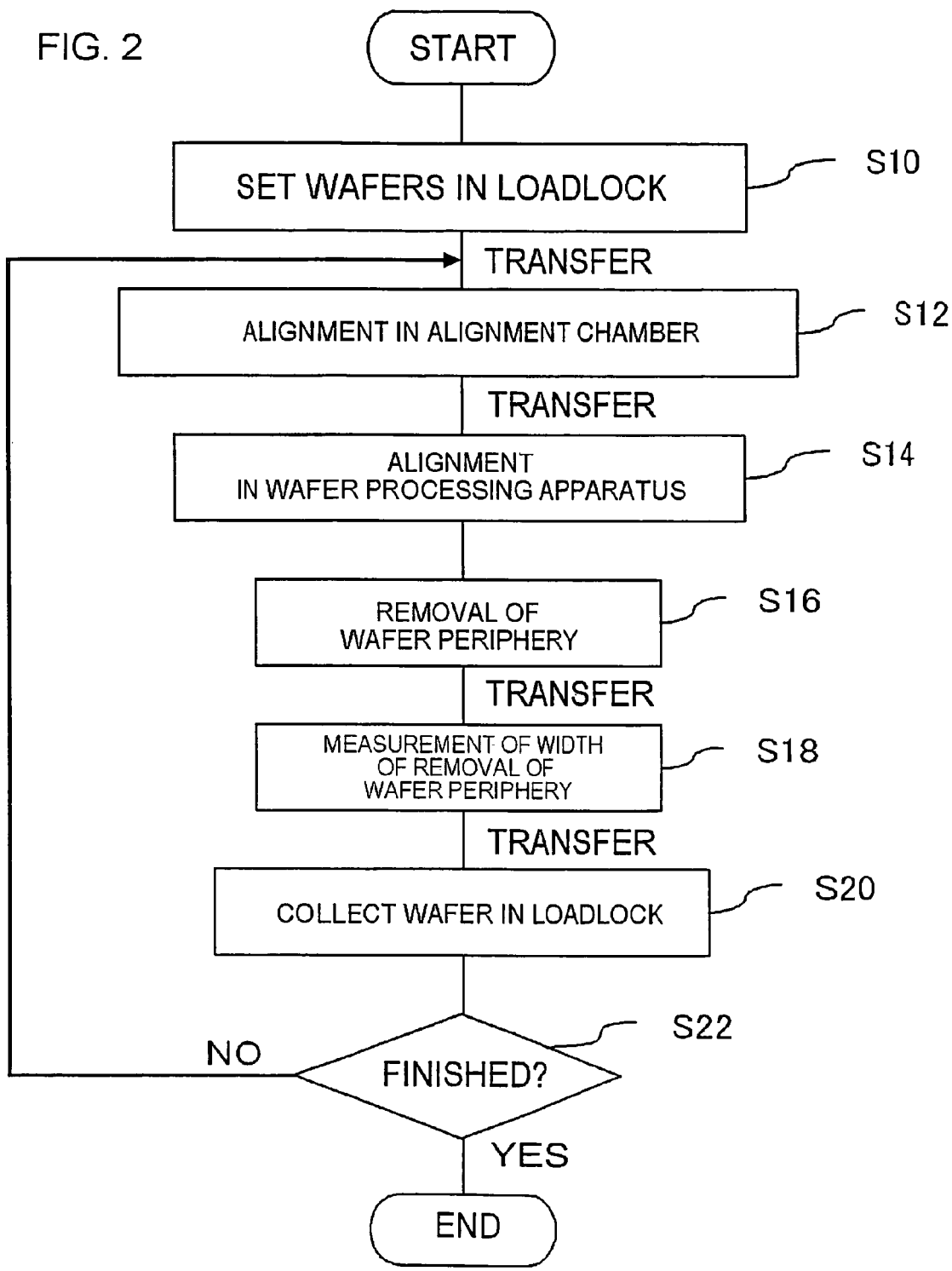
FIG. 2 is a flow chart showing procedures of wafer processing in the etching apparatus in the embodiment.

FIG. 2 is a flow chart showing procedures of the wafer processing in the etching apparatus 300 in the first embodiment. The procedures will be explained referring also to FIG. 1.

First, a plurality of wafers are set to the first loadlock 302 or the second loadlock 310 (S10). Next, a single wafer is transferred from the first loadlock 302 or the second loadlock 310 to the alignment chamber 304 so as to be aligned therein (S12). The alignment in the alignment chamber 304 takes place referring to a notch of the wafer. The wafer thus aligned in the alignment chamber 304 is then transferred to the wafer processing apparatus 100, and aligned in the wafer processing apparatus 100. The peripheral portion of the wafer is etched (S16).

Next, the wafer having the peripheral portion thereof etched in the wafer processing apparatus 100 is transferred to the peripheral removal width observation unit 306, where the width of removal of the peripheral portion of the wafer is measured (S18). The wafer is then transferred out from the peripheral removal width observation unit 306 and back into the other loadlock 302 or 310, and collected (S20). These procedures are repeated until all wafers set in the first loadlock 302 or the second loadlock 310 are processed, and after completion of all wafers (YES in S22), the procedures come to the end.

Because the wafer can be aligned in the wafer processing apparatus 100, the first embodiment is successful in equalizing the width of removal of the peripheral portion of the wafer.

Figure 3:
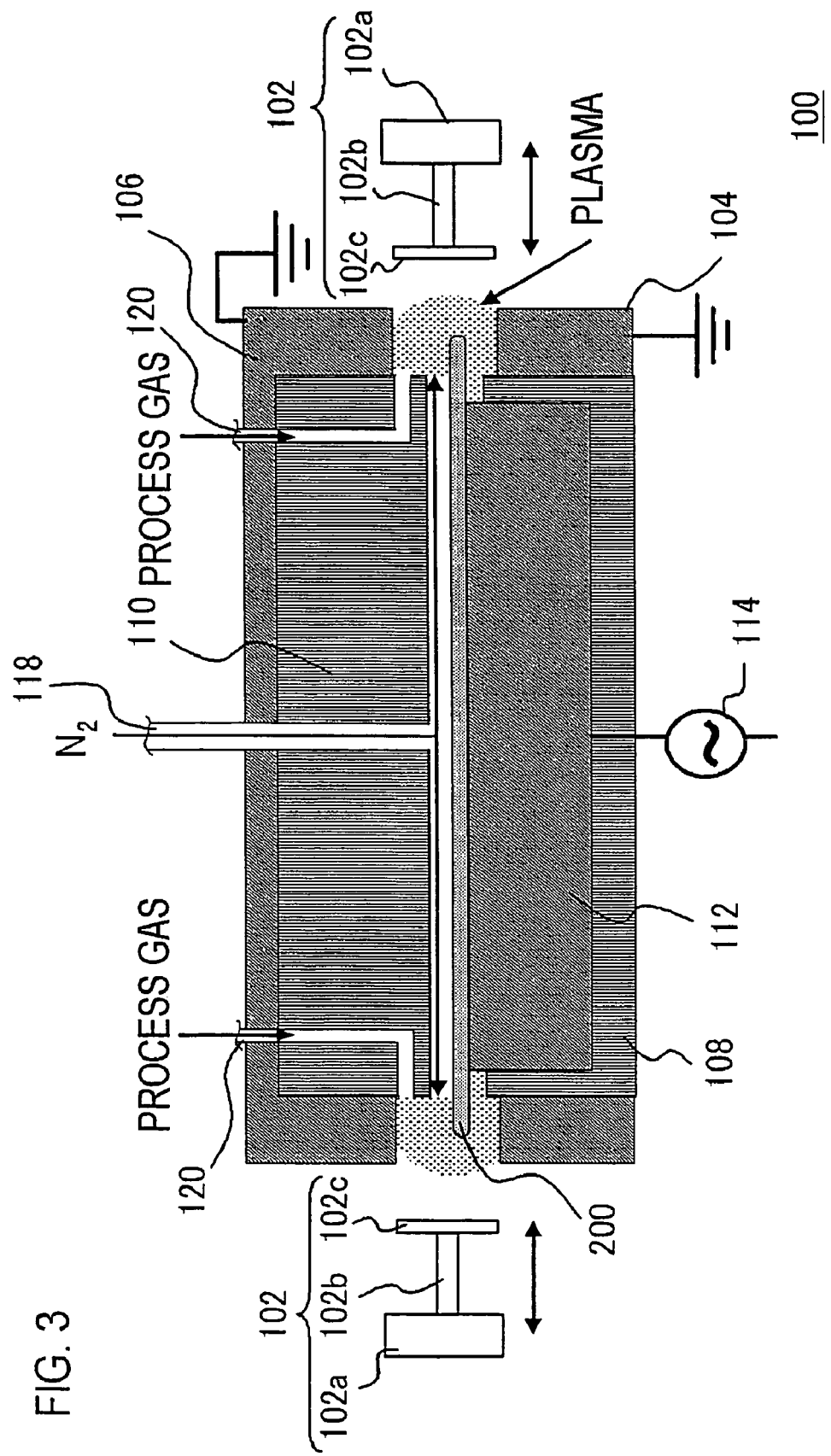
FIG. 3 is a sectional view showing a configuration of a wafer processing apparatus.

FIG. 3 is a sectional view showing a configuration of the wafer processing apparatus 100.

The wafer processing apparatus 100 herein is of the parallel flat-plate type. The wafer processing apparatus 100 includes a lower electrode 112 connected to a high-frequency power source 114, a grounded upper electrode 106, a ground electrode 104 provided around the lower electrode 112, an upper ceramic 110 provided between the upper electrode 106 and the lower electrode 112, and a lower ceramic 108 provided between the lower electrode 112 and the earth electrode 104.

The lower electrode 112 herein functions as a stage, on which a wafer 200 is placed. The upper ceramic 110 is disposed as covering the central upper region of the wafer, so as to prevent a plasma from contacting with the center portion of the wafer 200 placed on the lower electrode 112. The lower electrode 112 is configured as having a diameter smaller than that of the wafer 200. This makes it possible to allow the plasma during plasma etching to extend behind the back peripheral portion of the wafer 200, and to remove contaminants, films or the like adhered on the back peripheral portion of the wafer 200.

The wafer processing apparatus 100 further includes an etching-interfering gas introducing duct 118 which leads to the center portion of the wafer 200 placed on the lower electrode 112, and a process gas introducing duct 120 which leads to the peripheral portion of the wafer 200. This allows the process gas to be supplied only to the peripheral portion of the wafer 200. The etching-interfering gas may be an inert gas such as $N_2$ (nitrogen). In the first embodiment, the etching-interfering gas is $N_2$. By supplying the etching-interfering gas to the center portion of the wafer 200 as described in the above, the process gas can be supplied only to the peripheral portion of the wafer 200. This makes it possible to selectively remove the contaminants and films adhered on the peripheral portion of the wafer 200. The process gas may be an etching gas. The etching gas may differ depending on types of an object to be etched, wherein a fluorocarbon-base gas may be used for etching of a silicon oxide film, for example.

In the first embodiment, the wafer processing apparatus 100 further has a movable alignment mechanism 102 which includes a drive unit 102a, an arm unit 102b and a guard block 102c. This makes it possible to align the wafer 200 at a standard position even if it is loaded into the wafer processing apparatus 100 in a displaced manner. The standard position herein means a position where the center of the lower electrode 112 and the center of the wafer 200 coincide.

Figure 4A:
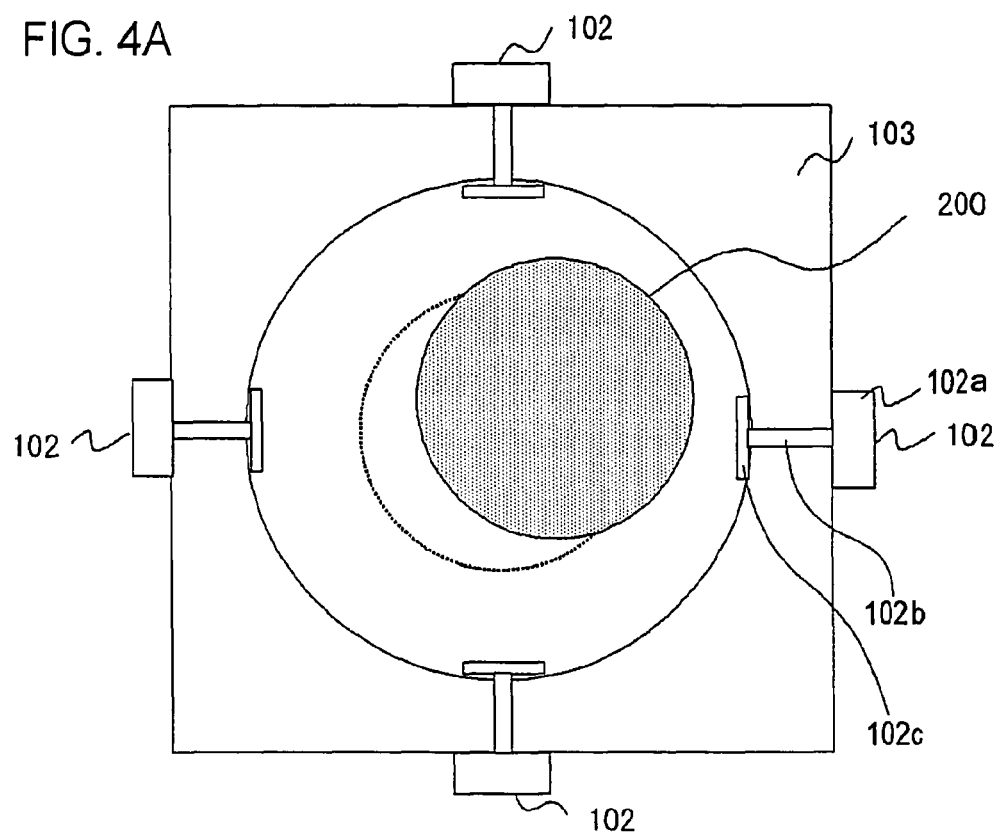
FIGS. 4A and 4B are top views schematically showing an alignment mechanism of the wafer processing apparatus in the embodiment.
Figure 4B:
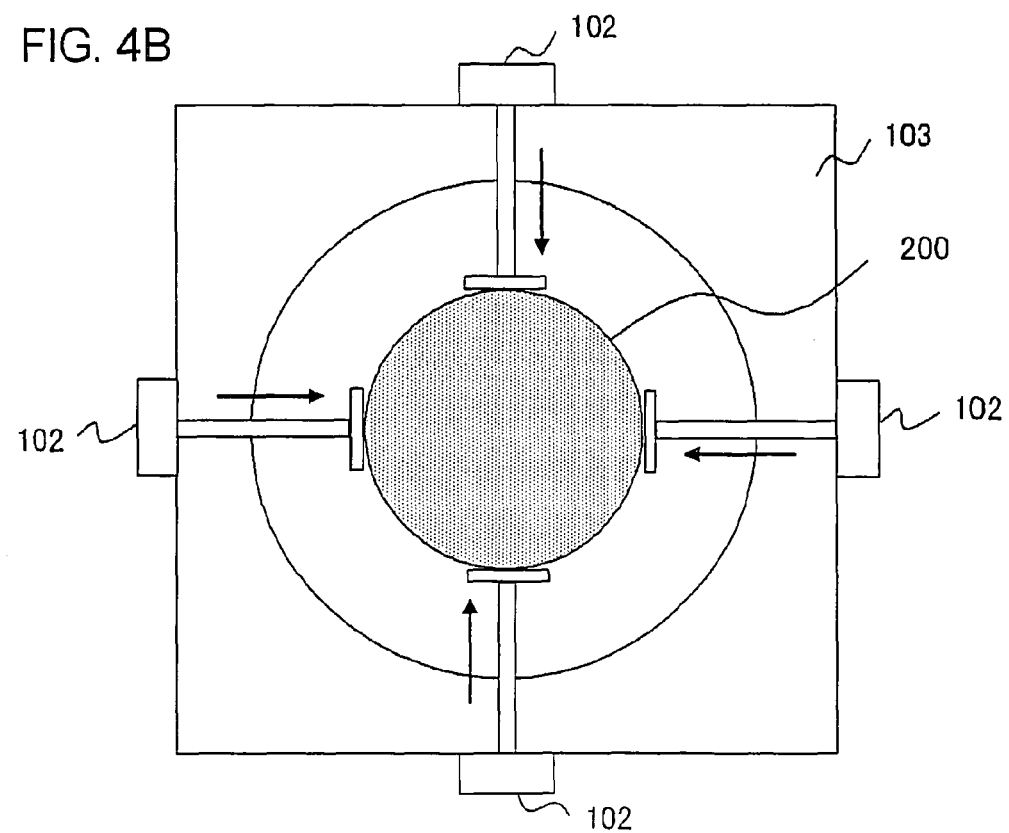

FIGS. 4A and 4B are top views schematically showing the alignment mechanism of the wafer processing apparatus 100 in the first embodiment. FIG. 4A shows a state in which the wafer 200 transferred from the alignment chamber 304 (see FIG. 1) is disposed as being shifted from the standard position. FIG. 4B shows a state in which the wafer 200 is aligned at the standard position.

The wafer 200 is transferred by an arm (not shown) provided to the transfer chamber 308, from the alignment chamber 304 to the wafer processing apparatus 100. The wafer 200 is then transferred from the arm onto three pins (not shown) in the wafer processing apparatus 100, and placed on the lower electrode 112.

The alignment mechanism 102 aligns the wafer 200 placed on the lower electrode 112. In the alignment mechanism 102, the drive unit 102a is provided to an inner wall 103 of the wafer processing apparatus 100 besides the lower electrode 112. The arm unit 102b is stretchable in the horizontal direction with the aid of the drive unit 102a, so as to move the guard block 102c between the inner wall 103 (state shown in FIG. 4A) and a predetermined position (state shown in FIG. 4B, for example) in the vicinity of the standard position. The guard block 102c is configured as being contactable with the wafer 200. The drive unit 102a drives the arm unit 102b so that the guard block 102c is positioned at the inner wall 103 when the wafer 200 is loaded into the wafer processing apparatus 100. After the wafer 200 is placed on the lower electrode 112, the drive unit 102a drives the arm unit 102b so as to position the guard block 102c at the standard wafer position. The alignment mechanism 102 is thus aligned at the standard wafer position. After the alignment, the drive unit 102a drives the arm unit 102b so that the guard block 102c is positioned at the inner wall 103. In the first embodiment, each of a plurality of drive units 102a of the alignment mechanisms 102 independently drives the arm unit 102b and the guard block 102c.

For example, the drive unit 102a of each alignment mechanism 102 can be configured as extending and retracting the arm unit 102b by a predetermined length, so as to move the guard block 102c to a predetermined position.

The guard block 102c is preferably configured using a plastic material such as TEFLON (Du Pont, registered trademark) and VESPEL (Du Pont, registered trademark), or a ceramic. In particular, the guard block 102c is preferably configured by a plastic material such as VESPEL. This makes it possible to reduce impact on the wafer 200 when the guard block 102c comes into contact with the wafer 200. It is also preferable that the guard block 102c has a linear or flat surface which comes into contact with the wafer 200. This is successful in precisely aligning the wafer 200.

The guard block 102c of the alignment mechanism 102 in the first embodiment is configured as moving in the transverse direction with respect to the lower electrode 112 as the stage, and is disposed at the inner wall 103 of the wafer processing apparatus 100 during the transfer of the wafer 200 and plasma etching of the wafer 200, so that the wafer 200 can be aligned without interfering the transfer and plasma etching.

Figure 5:
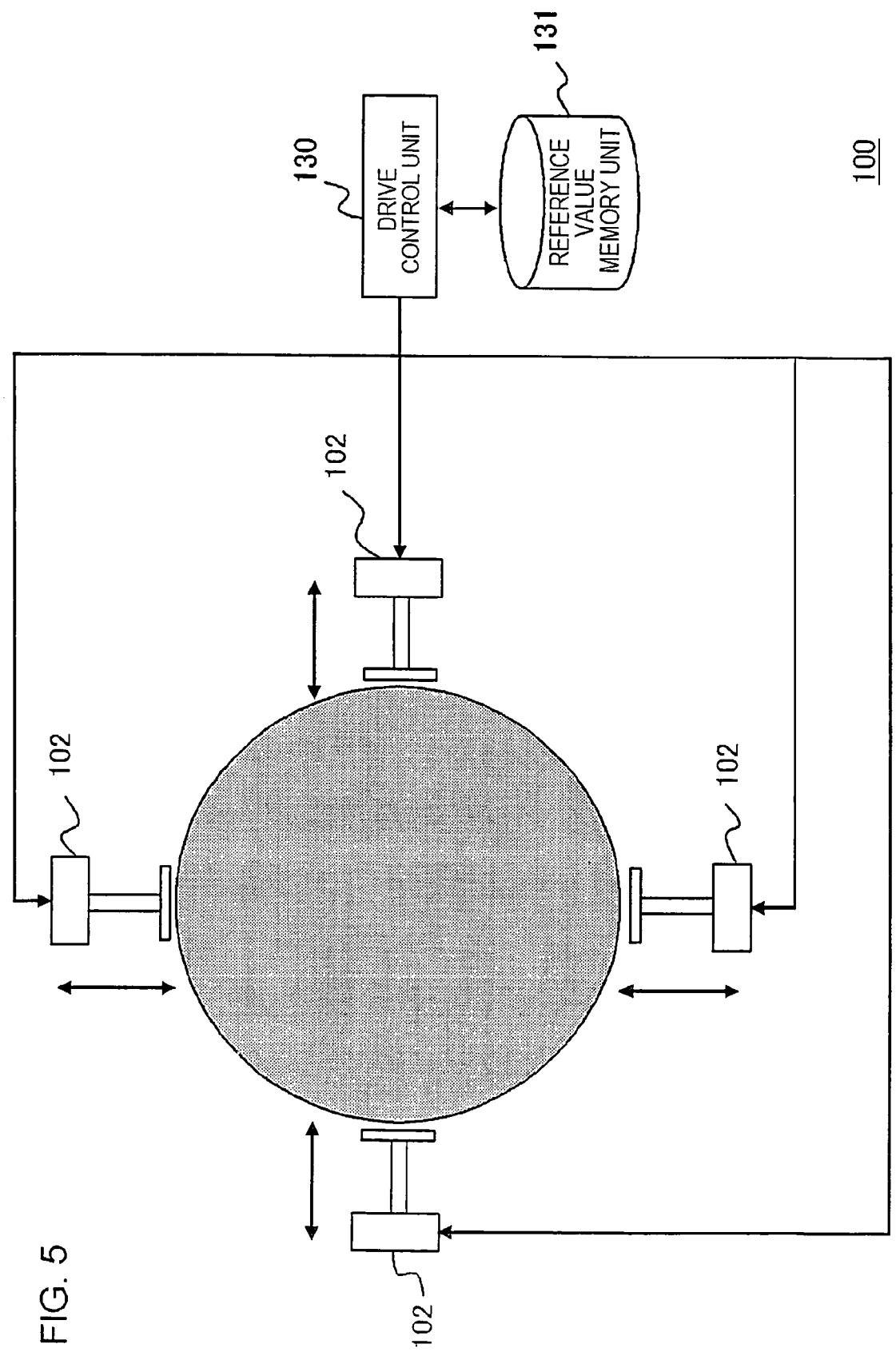
FIG. 5 is a drawing schematically showing a configuration of the etching apparatus in the embodiment.

FIG. 5 is a drawing schematically showing another exemplary configuration of the wafer processing apparatus 100 of the first embodiment.

The wafer processing apparatus 100 includes a drive control unit 130 independently controlling each of the drive units 102a of the plurality of alignment mechanisms 102, and a reference value memory unit 131 storing a reference value of stroke of each drive unit 102a of each alignment mechanism 102 extending and retracting the arm unit 102b. The drive control unit 130 acquires the stroke by which each drive unit 102a of each alignment mechanism 102 extends and retracts the arm unit 102, referring to the reference value memory unit 131, and controls the drive unit 102a. This makes it possible to move each alignment mechanism 102 by a predetermined stroke.

The etching apparatus 300 of the first embodiment can align the wafer even if the wafer causes displacement in the wafer processing apparatus 100. It is therefore made possible to correct the displacement, and to control uniformity in the width of removal of the peripheral portion of the wafer 200.

Second Embodiment

The second embodiment differs from the first embodiment in that the next wafer to be etched is aligned based on the width of removal of the peripheral portion of the wafer observed by the peripheral removal width observation unit 306.

Figure 6:
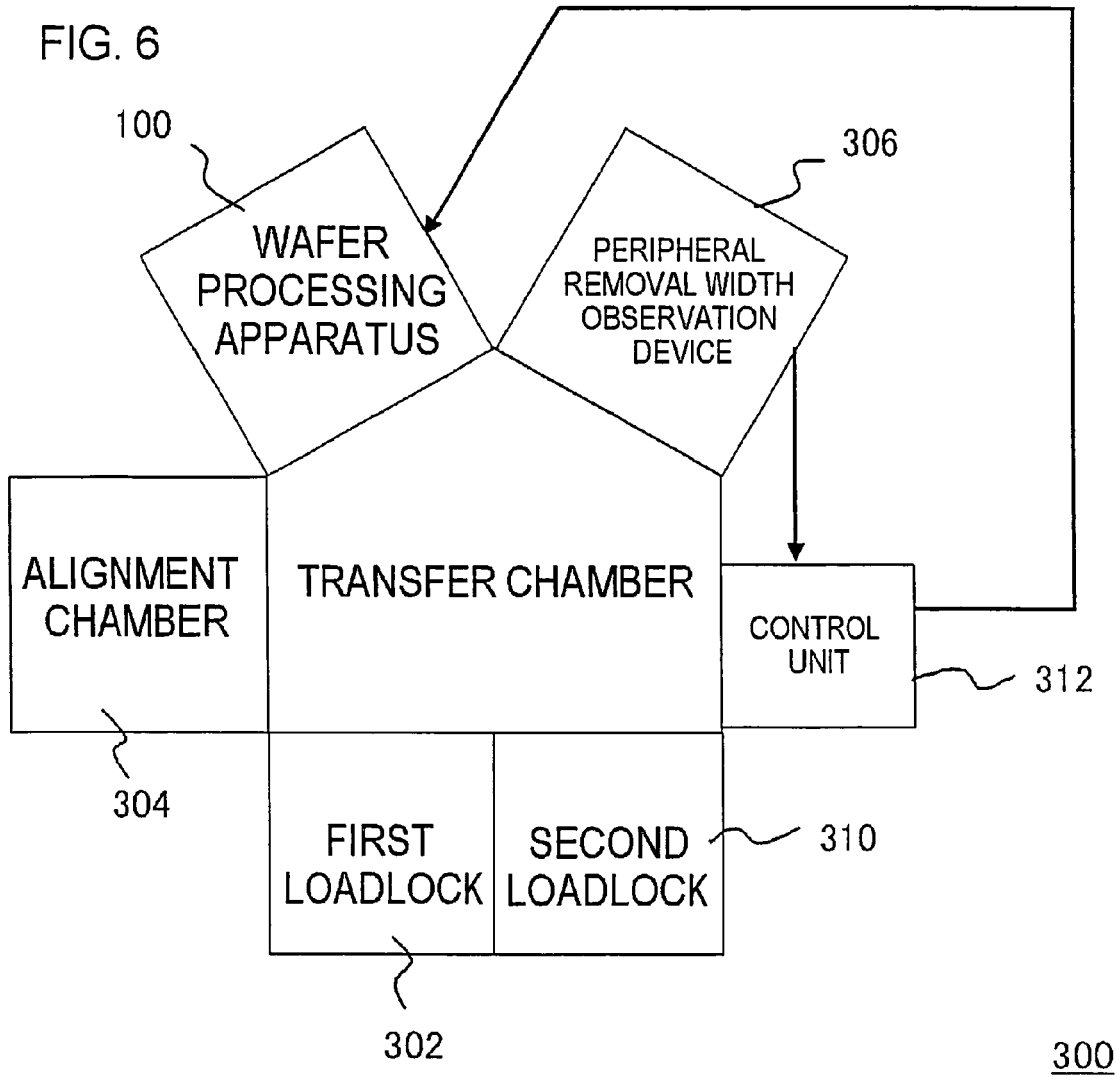
FIG. 6 is a drawing schematically showing another configuration of a wafer processing apparatus in the embodiment.

FIG. 6 is a drawing schematically showing a configuration of an etching apparatus of the second embodiment.

The etching apparatus 300 of the second embodiment further includes a control unit 312, in addition to the configuration of the etching apparatus 300 explained in the first embodiment referring to FIG. 1. The control unit 312 calculates displacement of the center of the wafer 200, based on the width of removal of the peripheral portion observed by the peripheral removal width observation unit 306. The control unit 312 transmits thus calculated displacement of the center of the wafer 200 to the wafer processing apparatus 100.

In the second embodiment, the wafer processing apparatus 100 has a configuration similar to that described in the first embodiment referring to FIG. 5. The drive control unit 130, upon being transmitted by the control unit 312 (shown in FIG. 6), controls stroke of the alignment mechanism 102, based on the displacement of the center of the wafer in the previous processing.

This makes it possible to accurately align the wafer 200 taking, for example, fluctuation in the plasma generation zone into consideration. The process may be carried out every time a single wafer 200 is processed by the etching apparatus 300, or may be carried out after processing of every several wafers.

Figure 7:
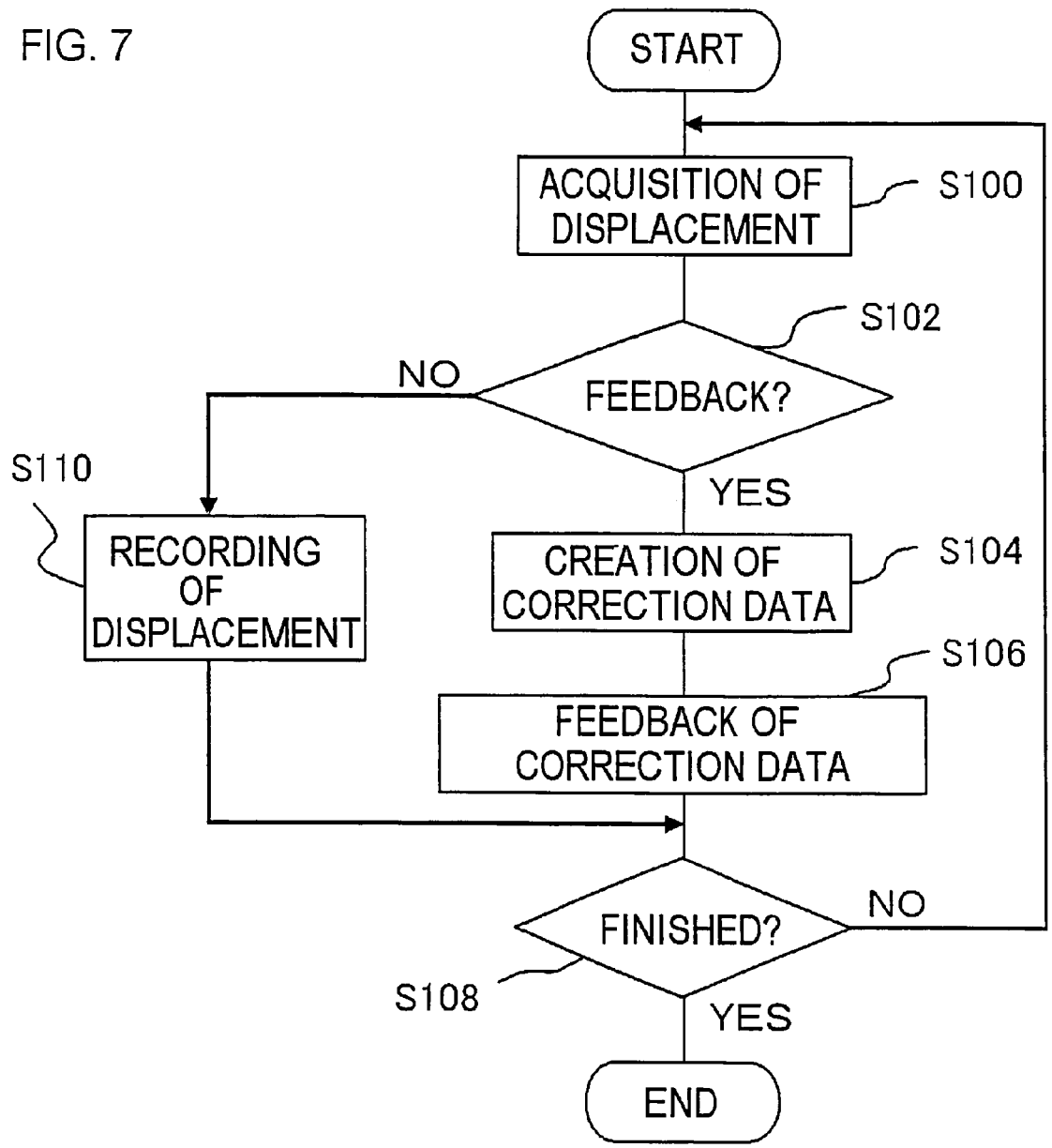
FIG. 7 is a flow chart showing procedures of a control unit in the embodiment.

FIG. 7 is a flow chart showing procedures of the processing by the control unit 312 in the second embodiment.

First, the control unit 312 acquires the displacement of the center of the wafer 200 from the peripheral removal width observation unit 306 (S100), and judges whether the displacement should be fed back to the wafer processing apparatus 100 (S102). For example, the control unit 312 compares the width of removal of the peripheral portion of the wafer 200 obtained from the peripheral removal width observation unit 306 with a reference value stored in the memory unit (not shown) of the control unit 312, and judges whether the peripheral portion of the wafer 200 was appropriately etched. If the peripheral portion of the wafer 200 was judged as being not appropriately etched, a judgment will be such that feedback is necessary (YES in S102).

When the displacement of the center is fed back to the wafer processing apparatus 100 (YES in S102), a correction data is created (S104). The correction data is then transimtted to a drive control unit 130 of the wafer processing apparatus 100 (S106). Whether the process should be completed or not is judged (S108), and the process goes back to step S100 if any unprocessed wafers 200 remain in the first loadlock 302 or the second loadlock 310 (NO in S102), and the same procedures are repeated. If no feedback is made in step S102 despite the dislocation, the displacement acquired in step S100 is stored in a predetermined memory unit (S110). The displacement may be transmitted to the wafer processing apparatus 100, wherein it is also allowable to store the displacement in the reference value memory unit 131. The process then goes to step S108, and the similar processing are repeated. If displacement values relevant to a plurality of wafers 200 are stored in the predetermined memory unit, it is also allowable, for example, to create the correction data by averaging these values. The control unit 312 can also create the correction data based on transition of the displacement relevant to a plurality of wafers 200.

When completion of all wafers 200 set in the first loadlock 302 or the second loadlock 310 is judged in step S108, the wafers 200 are collected in the other loadlock 302 or 310, and the process is completed (YES in S108).

If the correction data is transmitted to the wafer processing apparatus 100 in step S106, the drive control unit 130 of the wafer processing apparatus 100 drives the individual alignment mechanism 102 based on the correction data before the next wafer 200 is processed.

In the above-described configuration, the wafer 200 can be moved independently in a plurality of directions such as in the transverse direction and vertical direction, so that it is made possible to accurately align the wafer 200, by taking, for example, fluctuation in the plasma generation zone into consideration. It is also made possible to correctly position the wafer 200 even if, for example, the alignment mechanism 102 per se causes dislocation, or if the displacement should occur due to apparatus characteristics or other conditions. This makes it possible to control uniformity in the width of removal of the peripheral portion of the wafer 200.

Third Embodiment

The alignment mechanism 102, configured as having the drive unit 102a, the arm unit 102b and the guard block 102c in the first embodiment and in the second embodiment, may have another configuration.

Figure 8:
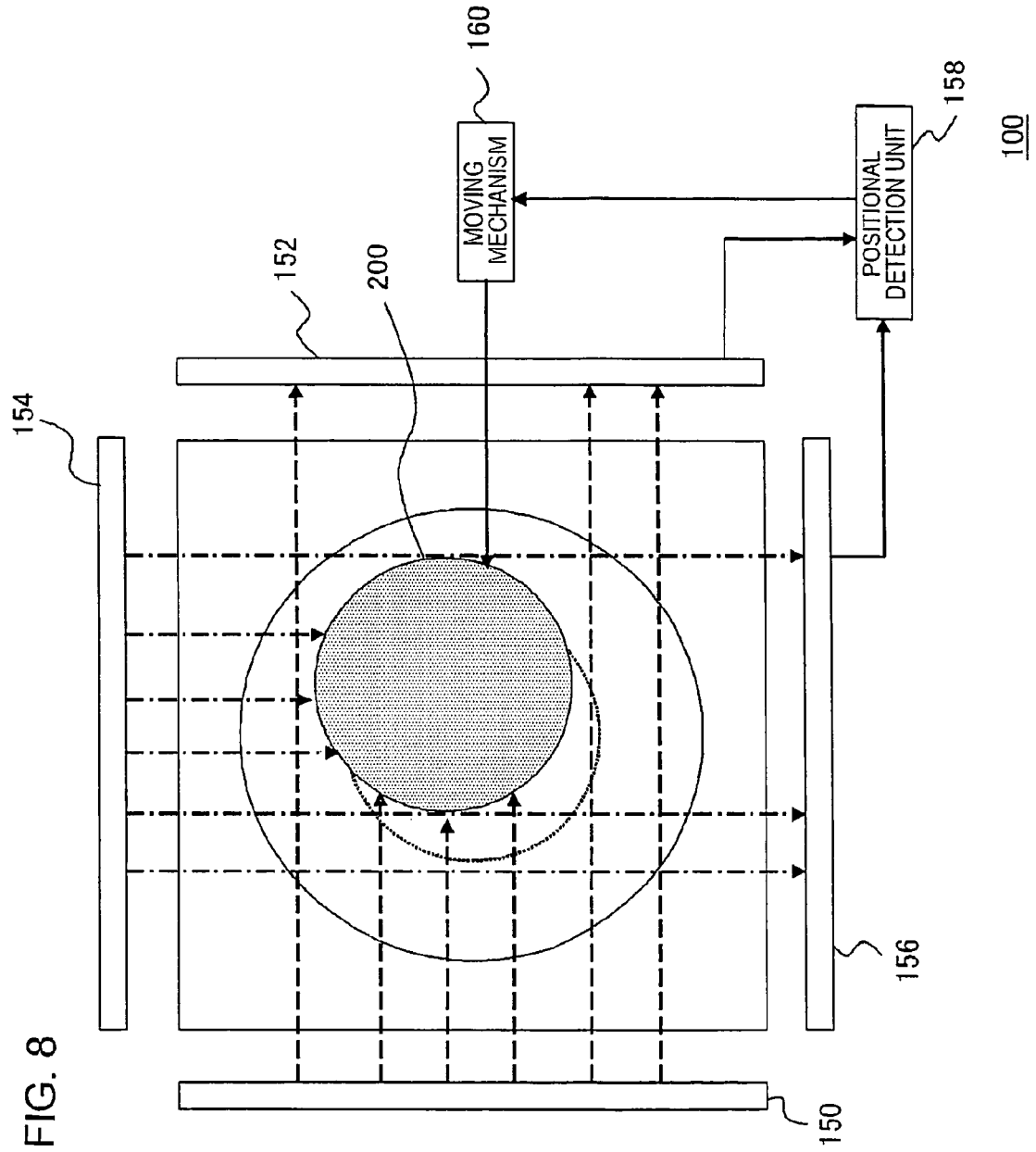
FIG. 8 is a schematic drawing showing a configuration of the wafer processing apparatus in the embodiment.

FIG. 8 is a schematic drawing showing a configuration of the wafer processing apparatus 100 in the third embodiment.

In the third embodiment, the alignment mechanism 102 includes a first monitor light emission unit 150, a first monitor light sensing unit 152, a second monitor light emission unit 154, a second monitor light sensing unit 156, a positional detection unit 158, and a moving mechanism 160.

The first monitor light emission unit 150 emits light, such as laser light, in a first direction. The first monitor light sensing unit 152 receives light emitted from the first monitor light emission unit 150. The second monitor light emission unit 154 emits light, such as laser light, in a second direction different from the first direction. The second monitor light sensing unit 156 receives light emitted from the second monitor light emission unit 154. In the third embodiment, the second direction is substantially normal to the first direction. The positional detection unit 158 detects a position of the wafer 200 based on an image of light received by the first monitor light sensing unit 152 and the second monitor light sensing unit 156. The positional detection unit 158 then controls a position of the moving mechanism 160, based on the detected position of the wafer 200. The moving mechanism 160 then moves the position of the wafer 200. The moving mechanism 160 can be configured by three pins provided in the lower electrode 112, and a member moving these pins in the horizontal direction using hydraulic pressure or the like.

Also in the third embodiment, effects similar to those described in the first embodiment can be obtained. In the third embodiment, it is also allowable to align the wafer to be etched next, based on difference in the width of removal of the peripheral portion of the wafer observed by the peripheral removal width observation unit 306, similarly to as described in the second embodiment.

Fourth Embodiment

The fourth embodiment differs from the first embodiment in that the flow rate of the etching-interfering gas is controlled in addition that the wafer 200 is aligned in the wafer processing apparatus 100 before the etching. Also in this embodiment, the etching apparatus 300 has a configuration similar to that described in the first embodiment referring to FIG. 1. In this embodiment, any constituents similar to those explained in the first embodiment and the second embodiment will be given with the similar reference numerals, so as to occasionally allow omission of repetitive explanation.

Figure 9:
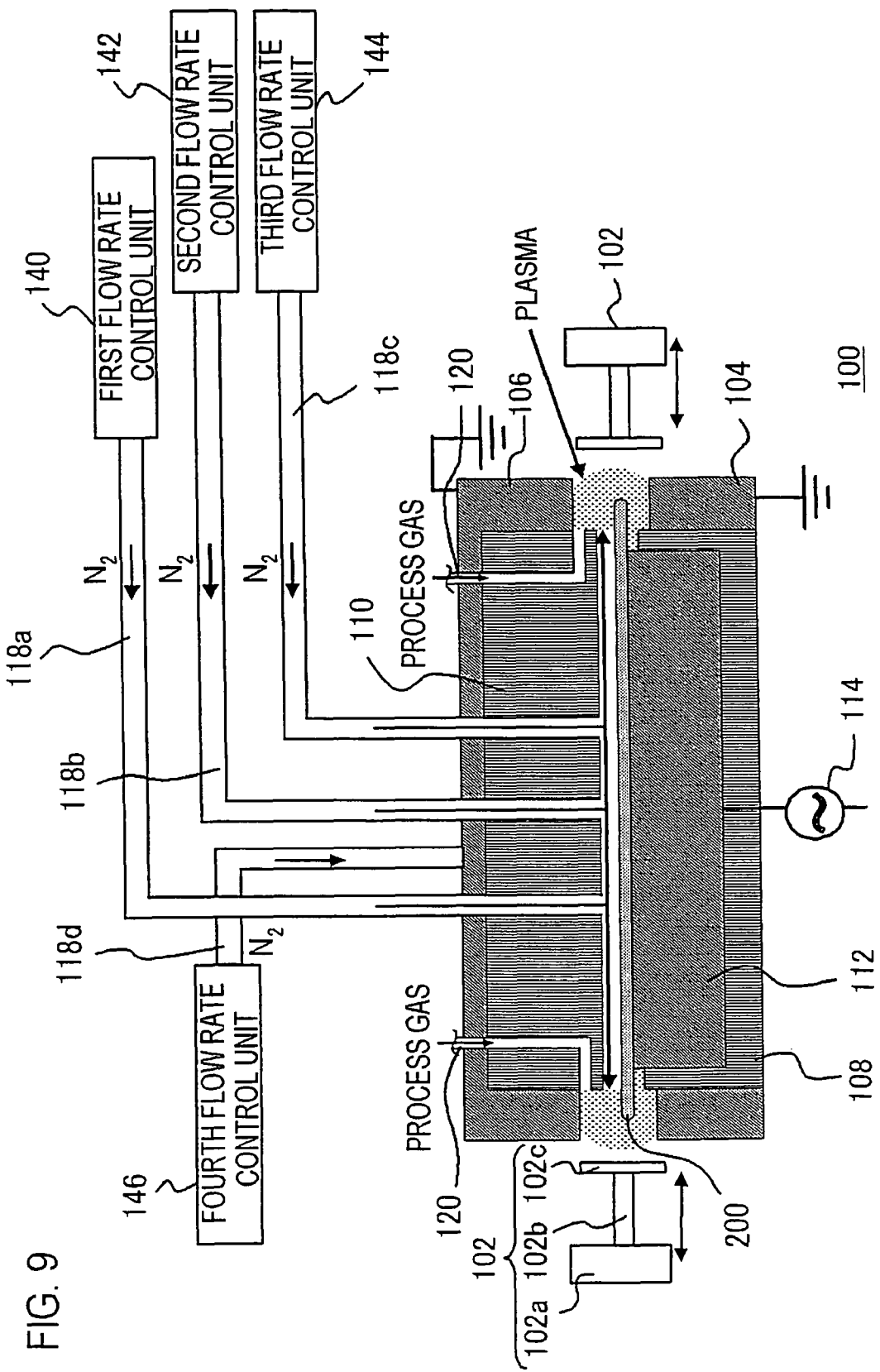
FIG. 9 is a sectional view showing a configuration of a wafer processing apparatus in the embodiment.
Figure 10:
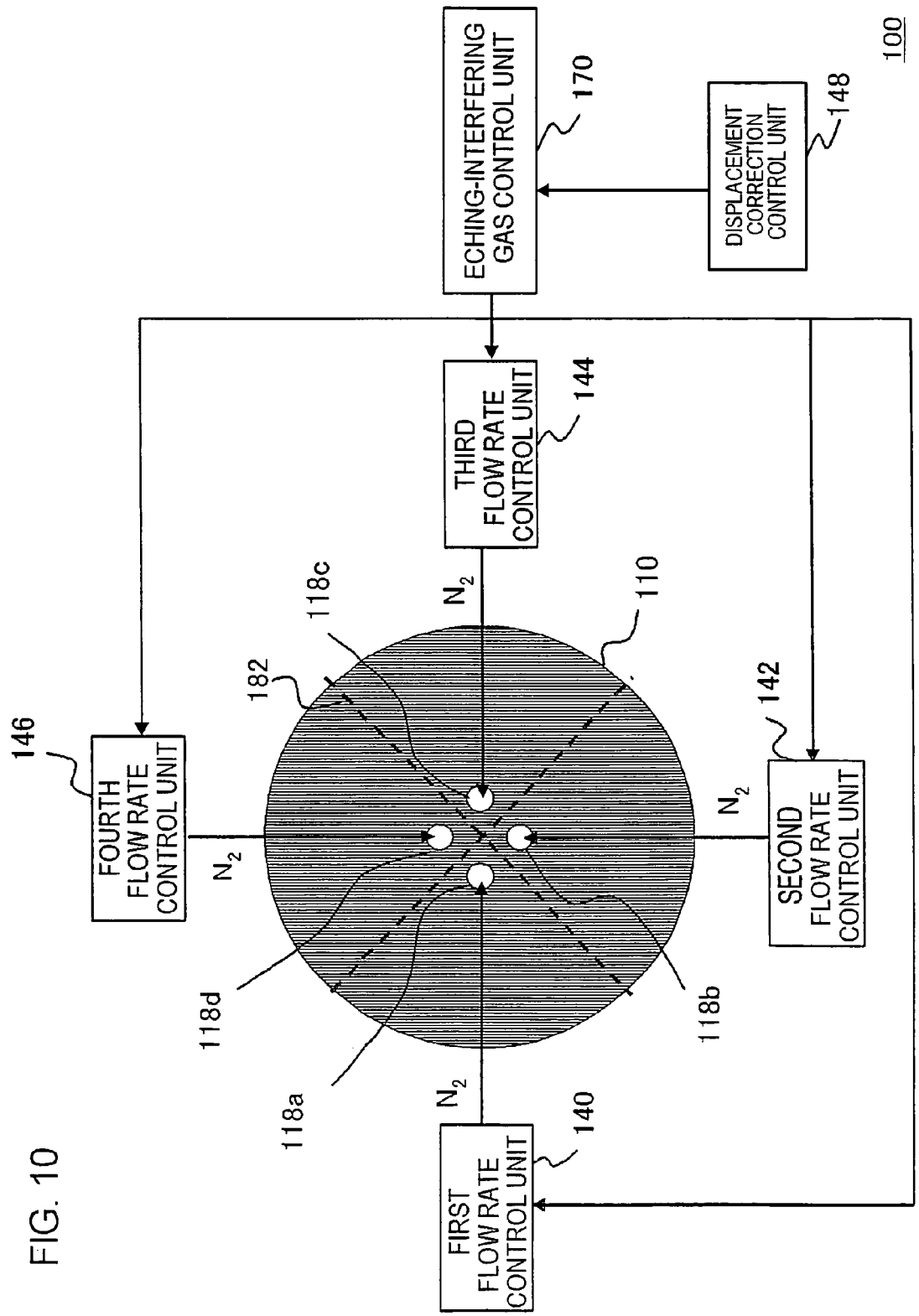
FIG. 10 is a top schematic view showing a part of the configuration of the wafer processing apparatus shown in FIG. 9.
Figure 11:
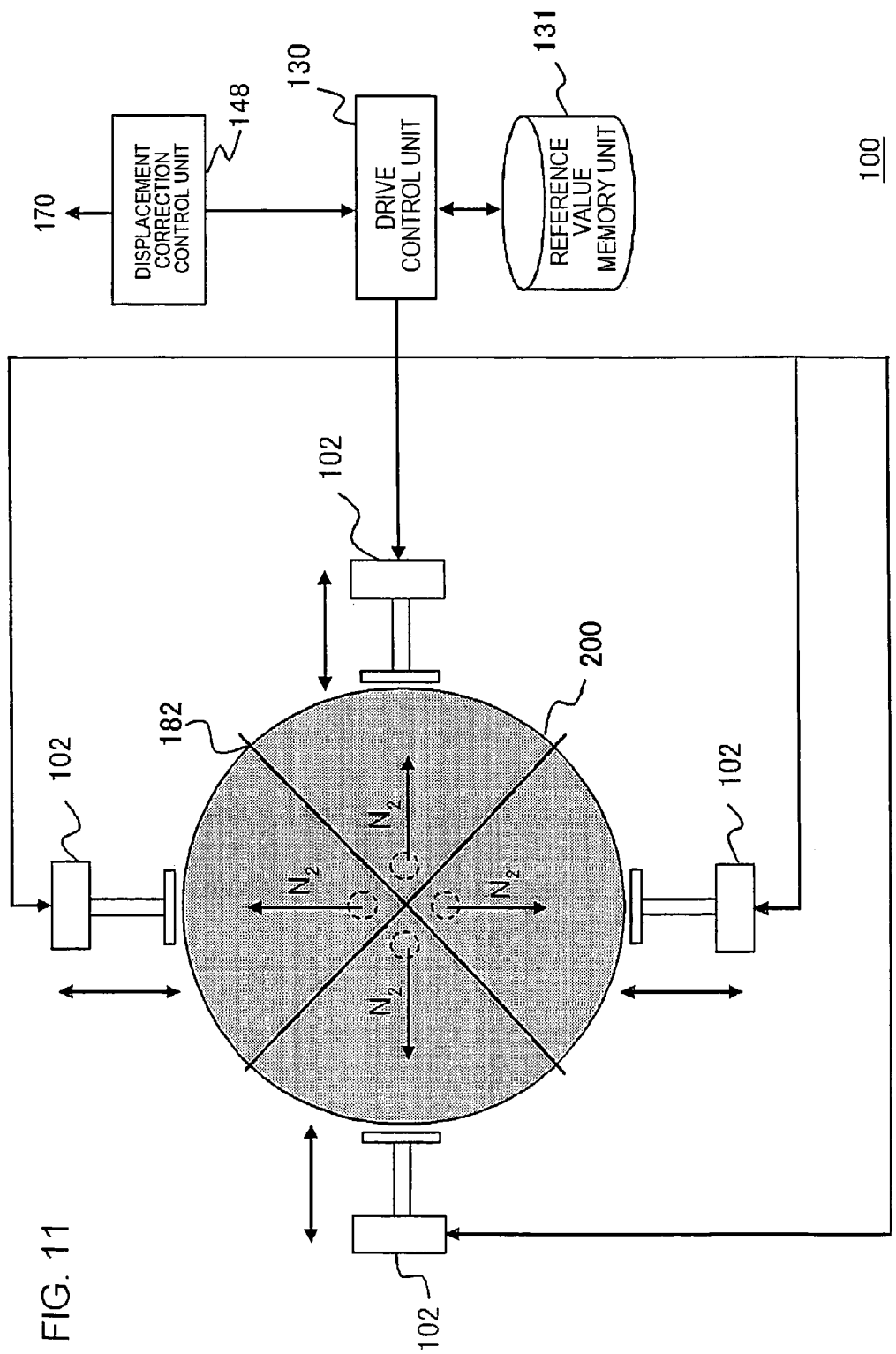
FIG. 11 is a top schematic view of a wafer placed on the wafer processing apparatus shown in FIG. 9.

FIG. 9 is a sectional view showing a configuration of the upper ceramic 110 of the wafer processing apparatus 100 in the fourth embodiment. FIG. 10 is a schematic top view showing a part of configuration of the wafer processing apparatus 100 shown in FIG. 9. FIG. 11 is a schematic top view showing the wafer 200 placed in the wafer processing apparatus 100 shown in FIG. 9.

In addition to the configuration of the wafer processing apparatus 100 explained in the first embodiment referring to FIG. 3 and FIG. 4, the wafer processing apparatus 100 further includes a plurality of ducts of a first etching-interfering gas introducing duct 118a, a second etching-interfering gas introducing duct 118b, a third etching-interfering gas introducing duct 118c and a fourth etching-interfering gas introducing duct 118d, each of which leads to the center portion of the wafer 200 placed on the lower electrode 112.

The wafer processing apparatus 100 further includes a first flow rate control unit 140, a second flow rate control unit 142, a third flow rate control unit 144, and a fourth flow rate control unit 146, controlling the supply volume of the etching-interfering gas supplied to a plurality of etching-interfering gas introducing ducts 118a to 118d, respectively. Each of the first flow rate control unit 140, the second flow rate control unit 142, the third flow rate control unit 144 and the fourth flow rate control unit 146 can typically be configured by a mass flow controller and a valve.

As shown in FIG. 10, the wafer processing apparatus 100 further includes an etching-interfering gas control unit 170 controlling the first flow rate control unit 140, the second flow rate control unit 142, the third flow rate control unit 144 and the fourth flow rate control unit 146. The etching-interfering gas control unit 170 independently controls volume of the etching-interfering gas supplied through the first flow rate control unit 140, the second flow rate control unit 142, the third flow rate control unit 144 and the fourth flow rate control unit 146. A partition plate 182, although not shown in FIG. 9, is also provided between the upper ceramic 110 and the lower electrode 112. In the fourth embodiment, the partition unit 182 is disposed so as to radially quadrisect the upper ceramic 110. The partition plate 182 is preferably configured so as not to contact with the wafer 200 placed on the lower electrode 112. The etching-interfering gas discharged from the plurality of etching-interfering gas introducing ducts 118a to 118d is introduced into each region partitioned by the partition unit 182. This makes it possible to control volume of the gas to be introduced for every region, and to equalize the width of removal of the peripheral portion.

As shown in FIG. 11, also the wafer processing apparatus 100 in the fourth embodiment can be configured as having the drive control unit 130 and a reference value memory unit 131. The wafer processing apparatus 100 can still further include a displacement correction control unit 148 controlling the etching-interfering gas control unit 170 and the drive control unit 130. When the displacement correction control unit 148 receives the correction data from the control unit 312 (see FIG. 6), the displacement correction control unit 148 controls the drive control unit 130 and the etching-interfering gas control unit 170, based on the displacement of the center of the wafer 200 in the previous process. The drive control unit 130 controls the stroke of the alignment mechanism 102, based on the displacement of the wafer 200 in the previous process. The etching-interfering gas control unit 170 controls the supply volumes of the etching-interfering gas supplied through the first flow rate control unit 140, the second flow rate control unit 142, the third flow rate control unit 144, and the fourth flow rate control unit 146, based on the displacement of the center of the wafer 200 in the previous process.

This makes it possible to accurately align the wafer 200. The process may be carried out every time a single wafer 200 is processed by the etching apparatus 300, or may be carried out after processing of every several wafers.

Figure 12:
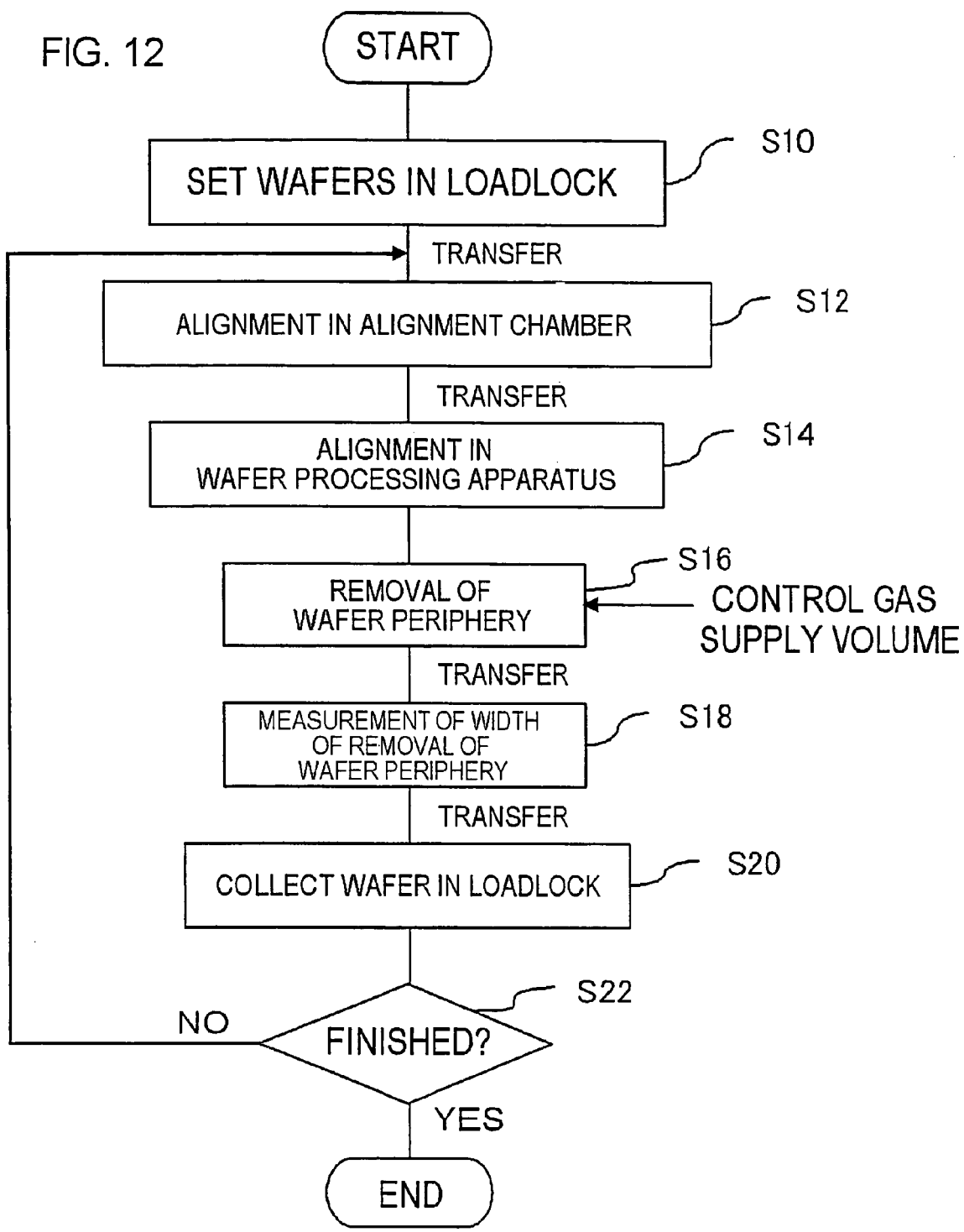
FIG. 12 is a flow chart showing procedures of wafer processing in the etching apparatus in the embodiment in the etching apparatus.

FIG. 12 is a flow chart showing procedures of the wafer processing in the etching apparatus 300 of the fourth embodiment.

First, the wafers are set in the first loadlock 302 or the second loadlock 310 (S10). Next, a single wafer is transferred from the first loadlock 302 or the second loadlock 310 to the alignment chamber 304, and is aligned in the alignment chamber 304 (S12). Then the wafer aligned in the alignment chamber 304 is transferred to the wafer processing apparatus 100, and is aligned in the wafer processing apparatus 100 (S14). The wafer is then subjected to removal of the peripheral portion thereof in the wafer processing apparatus 100 (S16). In the fourth embodiment, the supply volume of the gas is controlled in this process.

Next, the wafer having the peripheral portion etched therefrom in the wafer processing apparatus 100 is then transferred to the peripheral removal width observation unit 306, where measurement is made on the width of removal of the peripheral portion of the wafer (S18). The wafer is then transferred from the peripheral removal width observation unit 306 back into the other loadlock 302 or 310, and is recovered therein (S20). These processes are repeated until all wafers set in the first loadlock 302 or the second loadlock 310 are processed, and the process comes to the end when all wafers set in the first loadlock 302 or the second loadlock 310 are processed (YES in S22).

Also in the fourth embodiment, effects similar to those described in the first embodiment and the second embodiment can be obtained. Because any misalignment of the wafer 200 and supply volume of the etching-interfering gas can be corrected at the same time, it is made possible to more finely control the uniformity in the width of removal of the peripheral portion of the wafer 200, by taking, for example, fluctuation in the plasma generation zone into consideration.

Fifth Embodiment

The fifth embodiment differs from the fourth embodiment in that flow volume of the process gas is further controlled. Also in the fifth embodiment, the etching apparatus 300 has a configuration similar to that described in the first embodiment referring to FIG. 1. In the fifth embodiment, any constituents similar to those explained in the first to fourth embodiments will be given with the similar reference numerals, so as to occasionally allow omission of repetitive explanation.

Figure 13:
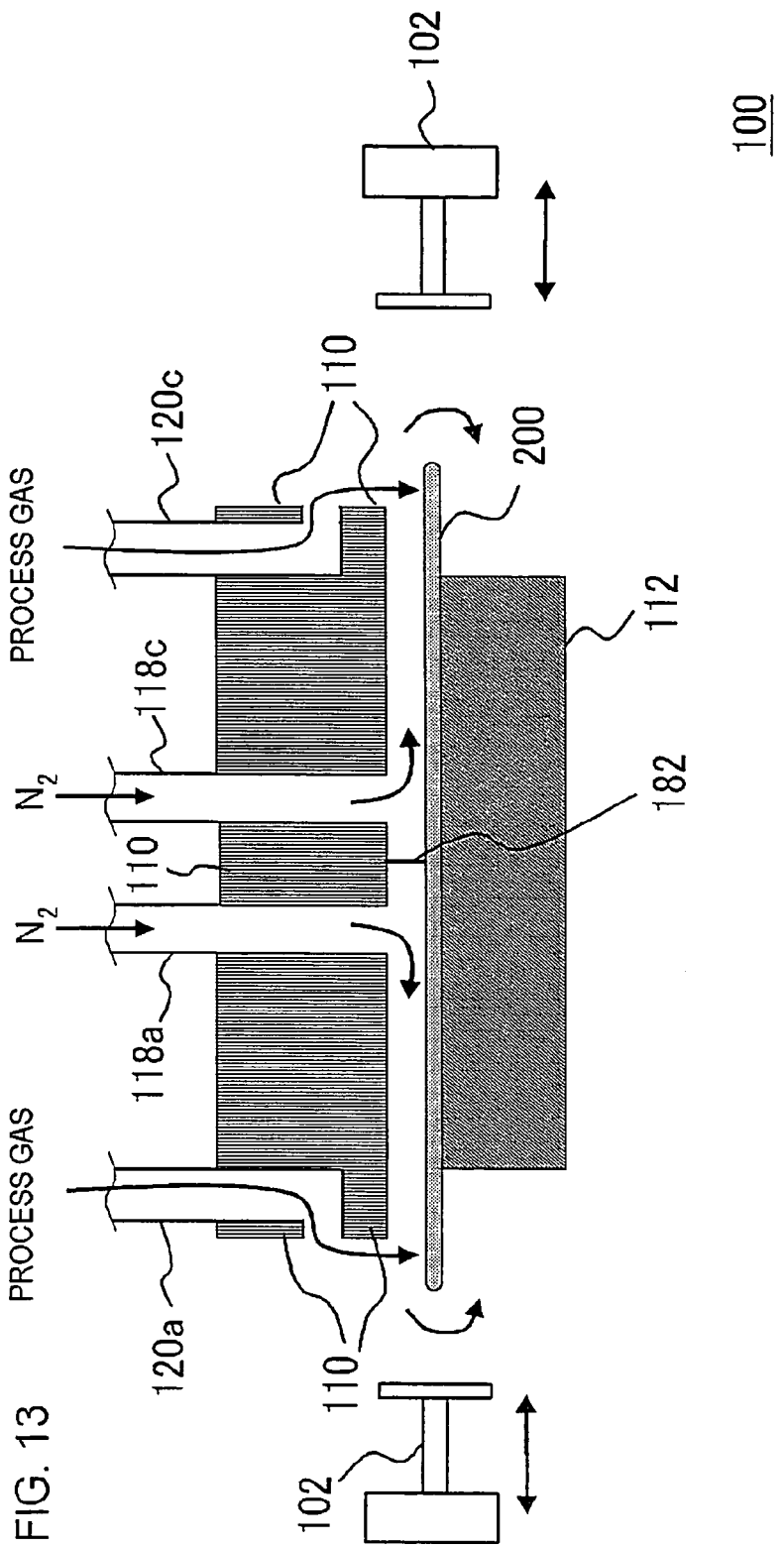
FIG. 13 is a sectional view showing a configuration of the wafer processing apparatus in the embodiment.
Figure 14:
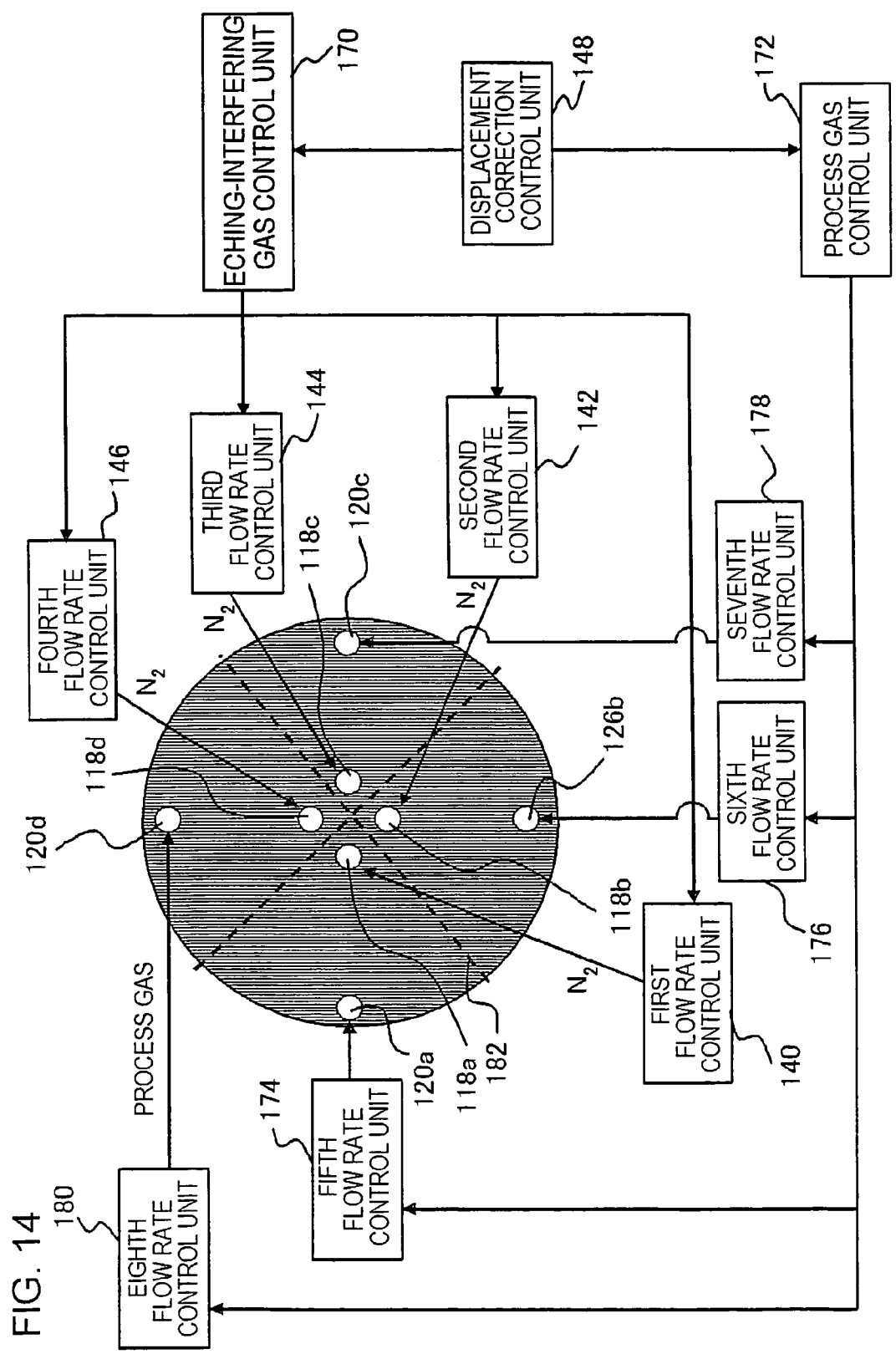
FIG. 14 is a top schematic view showing a part of the configuration of the wafer processing apparatus shown in FIG. 13.
Figure 15:
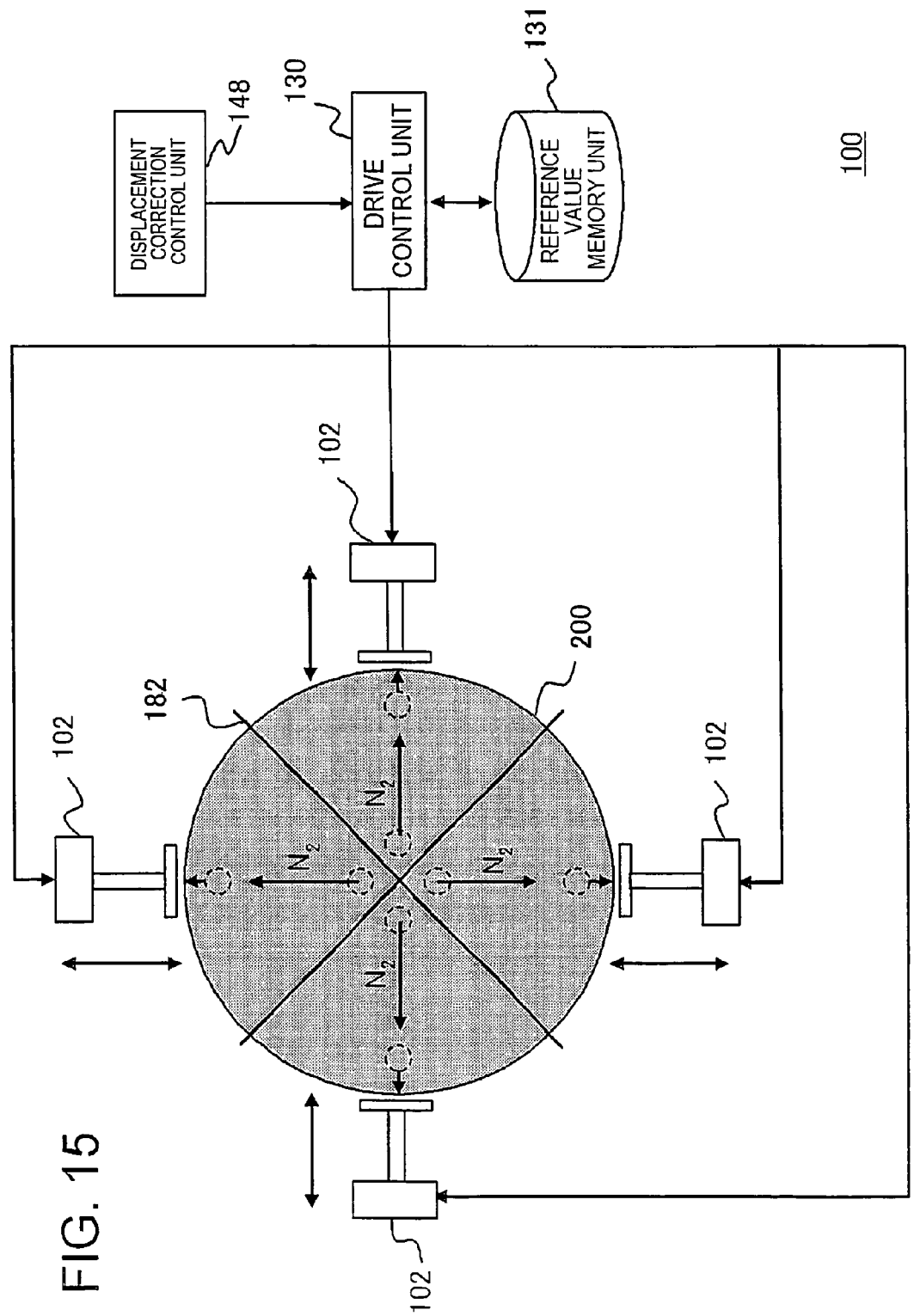
FIG. 15 is a top schematic view of a wafer placed on the wafer processing apparatus shown in FIG. 13.

FIG. 13 is a sectional view showing a configuration of the wafer processing apparatus 100 in the fifth embodiment. FIG. 14 is a top schematic view showing a configuration of the wafer processing apparatus 100 shown in FIG. 13. FIG. 15 is a schematic drawing showing the wafer 200 placed on the wafer processing apparatus 100 shown in FIG. 13.

In addition to the configuration of the wafer processing apparatus 100 explained in the fourth embodiment referring to FIG. 9 to FIG. 11, the wafer processing apparatus 100 further includes a first process gas introducing duct 120a, a second process gas introducing duct 120b, a third process gas introducing duct 120c and a fourth process gas introducing duct 120d, each of which leads to the peripheral portion of the wafer 200 placed on the lower electrode 112. FIG. 13 shows only constituents necessary for the explanation, and does not show the upper electrode 106, the lower ceramic 108, the earth electrode 104 and so forth, but the wafer processing apparatus 100 in the fifth embodiment also includes these constituents similarly to as in the configuration shown in FIG. 9.

As shown in FIG. 14, the wafer processing apparatus 100 further includes a fifth flow rate control unit 174, a sixth flow rate control unit 176, a seventh flow rate control unit 178 and an eighth flow rate control unit 180, each of which controls the supply volume of the process gas supplied through the plurality of process gas introducing ducts 120a to 120d. Each of the fifth flow rate control unit 174, the sixth flow rate control unit 176, the seventh flow rate control unit 178 and the eighth flow rate control unit 180 can typically be configured by a mass flow controller and a valve.

The partition unit 182 herein is provided between the upper ceramic 110 and the lower electrode 112, so as to introduce the gases discharged from the etching-interfering gas introducing ducts 118a to 118d, and from the process gas introducing ducts 120a to 120d into the respective regions partitioned by the partition unit 182. This makes it possible to control, by regions, the amount of introduction of the etching-interfering gas and the process gas, and to make adjustment so as to equalize the width of removal of the peripheral portion.

The process gas control unit 172 controls the fifth flow rate control unit 174, the sixth flow rate control unit 176, the seventh flow rate control unit 178 and the eighth flow rate control unit 180, so as to independently control the supply volume of the process gas supplied therethrough. A displacement correction control unit 148 controls the etching-interfering gas control unit 170 and the process gas control unit 172.

As shown in FIG. 15, also the wafer processing apparatus 100 in the fifth embodiment can be configured as having the drive control unit 130. When the displacement correction control unit 148 receives the correction data from the control unit 312 (see FIG. 6), the displacement correction control unit 148 controls the etching-interfering gas control unit 170, the process gas control unit 172 and the drive control unit 130. The drive control unit 130 controls the stroke of the alignment mechanism 102, based on the displacement of the wafer 200 in the previous process. The process gas control unit 172 controls the supply volumes of the process gas supplied through the fifth flow rate control unit 174, the sixth flow rate control unit 176, the seventh flow rate control unit 178 and the eighth flow rate control unit 180, based on the displacement of the center of the wafer 200 in the previous process. This makes it possible to accurately align the wafer 200. The process may be carried out every time a single wafer 200 is processed by the etching apparatus 300, or may be carried out after processing of every several wafers.

FIG. 16 is a schematic drawing showing an adjustment of the width of removal of the peripheral portion of the wafer by controlling the supply volume of the process gas in the fifth embodiment.

As shown in the drawing, angle θ of supply of the process gas supplied to the wafer 200 is variable by controlling the supply volume of the process gas through the process gas introducing duct 120. It is therefore made possible to adjust the width of removal of the peripheral portion of the wafer 200, by appropriately setting such angle of supply.

Also in the fifth embodiment, effects similar to those described in the fourth embodiment can be obtained. Because any misalignment of the wafer 200, supply volume of the etching-interfering gas, and supply volume of the process gas can be corrected at the same time, it is made possible to more finely control the uniformity in the width of removal of the peripheral portion of the wafer 200, by taking, for example, fluctuation in the plasma generation zone into consideration. It is also made possible to equalize the etching rate by correcting the supply volume of the process gas.

EXAMPLES

Example 1

The wafer was aligned using the wafer processing apparatus 100 explained in the first embodiment referring to FIG. 3, FIGS. 4 4A, 4B, and FIG. 5, and the peripheral portion of the wafer was etched with the notch directed downward. The widths of removal of the edges in the X direction are defined as "a" and "a'", and the widths of removal of the edges in the Y direction are defined as "b" and "b'" (see FIG. 17A for example).

Example 2

The peripheral portion of the wafer, not aligned, was etched using the wafer processing apparatus 100 explained in the first embodiment referring to FIG. 3, FIGS. 4 4A, 4B, and FIG. 5, with the notch directed downward.

Results are shown in FIG. 18. Example 1 in which the wafer was aligned in the wafer processing apparatus 100 before the etching was successful in equalizing the widths of removal "a" and "a'" in the X direction and the widths of removal "b" and "b'" in the Y direction. Whereas Example 2 in which the wafer was not aligned in the wafer processing apparatus 100 before the etching was unsuccessful in equalizing the widths of removal of the peripheral portion, showing the width of removal "a" larger than "a'" in the X direction, and the width of removal "b" larger than "b'" in the Y direction. As is clear from the results, Example 1 can equalize the width of removal of the peripheral portion, and consequently can increase the area for element formation.

Figure 17A:
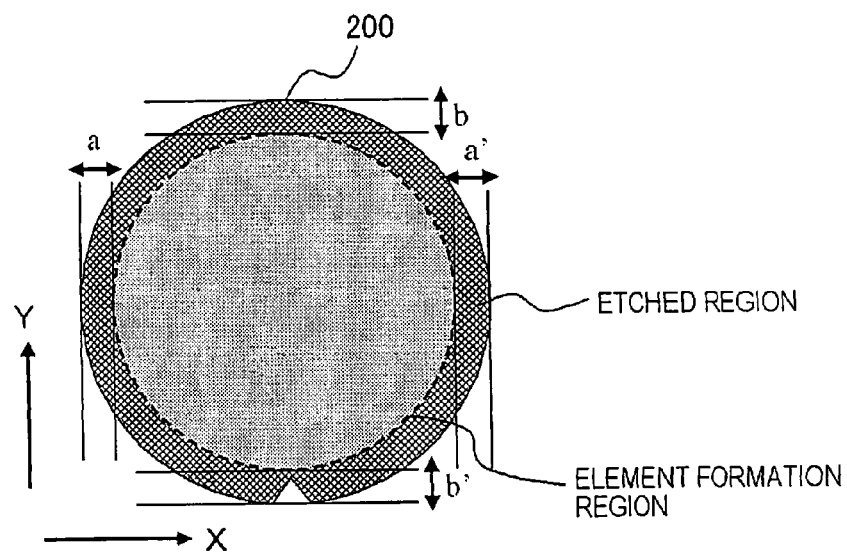
FIGS. 17A and 17B are drawings schematically showing results of Examples.
Figure 17B:
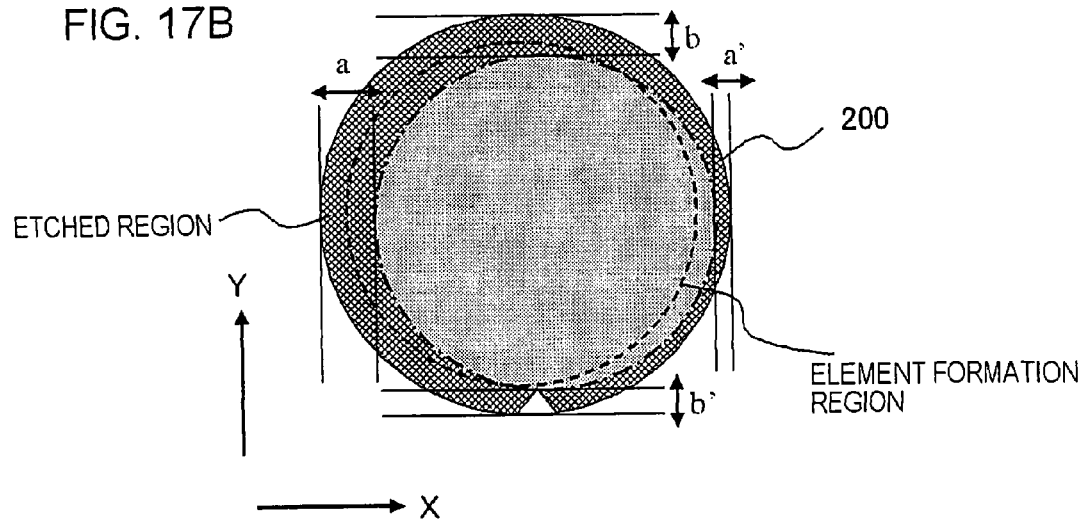

In FIGS. 17A and 17B, the center portion surrounded by a dashed line indicates the element formation region, and a cross-hatched portion indicates an etched region. FIG. 17A is a drawing schematically showing the result of Example 1. It can be found that the control herein is successful in equalizing the width of removal of the peripheral portion of the wafer 200. The etched region on the periphery of the wafer 200 and the element formation region do not overlap, so that the element formation region will never be damaged by the etching of the peripheral portion. This makes it possible to increase the number of effective chips obtainable therefrom, and to improve productivity of the semiconductor chips.

On the other hand, FIG. 17B is a drawing schematically showing the result of Example 2. It can be found that the width of removal of the peripheral portion of the wafer 200 is non-uniform. The element formation region is therefore partially etched, and the element formation region is damaged due to such etching of the peripheral portion. This is causative of the reduced number of effective chips obtainable therefrom, and a degraded productivity of the semiconductor chips.

The present invention has been described in the above based on the embodiments. It is to be understood by those skilled in the art that these embodiments are merely of exemplary purposes, and allows any modifications in combination of the individual constituents and the individual processes, and that also such modifications fall within a scope of the present invention.

Also in the wafer processing apparatus 100 explained in the third embodiment, the fourth embodiment and the fifth embodiment, it is allowable to align, in the etching process, the next wafer to be etched and to control the flow rate of the gas, by feeding back the displacement of the width of removal of the peripheral portion of the wafer observed by the peripheral removal width observation unit 306, similarly to as described in the second embodiment.

The wafer processing apparatus 100 in the above-described embodiments was configured as having four alignment mechanisms 102 so as to effect the alignment in four directions, wherein the number of the alignment mechanisms 102 may be arbitrary, so far as the wafer 200 can appropriately be aligned. Geometry of the guard block 102c may be any other various geometries including arc.

The etching apparatus 300 in the above-described embodiments was configured as having the wafer processing apparatus 100 and the peripheral removal width observation unit 306, whereas it is also allowable to configure the wafer processing apparatus 100 as having a function of the peripheral removal width observation unit 306.

The present invention may include the following configuration.

A method of selectively etching the peripheral portions of a plurality of wafers in a successive manner, comprising:
   selectively etching the peripheral portion of a single wafer placed on a stage;
   observing width of removal of the peripheral portion of the wafer etched in said selectively etching; and
   calculating difference in said width of removal occurred in said selectively etching, by comparing said width of removal observed in said observing with a predetermined reference value;
   wherein in said selectively etching, the next wafer is aligned on said stage, based on said difference calculated in said calculating.

A method of selectively etching the peripheral portion of the wafer, comprising:
   aligning a single wafer placed on a stage to a predetermined position; and
   selectively etching the peripheral portion of a single wafer, using an etchant etching said peripheral portion, and an etching-interfering agent interfering supply of said etchant to the center of the wafer,
   wherein in said selectively etching, at least either of said etchant and said etching-interfering agent is supplied from a plurality of positions, and supply volume of the material to be supplied at each of said positions is independently controlled.

The above method of selectively etching the peripheral portion of the wafer, intended for successively etching the peripheral portions of a plurality of wafers, further comprising:
   observing width of removal of the peripheral portion of the wafer etched in said selectively etching; and
   calculating difference in said width of removal occurred in said selectively etching, by comparing said width of removal observed in said observing with a predetermined reference value;
   wherein in said selectively etching, supply volume of said matter to be supplied at each of said positions is independently controlled, based on said difference calculated in said calculating.

It is apparent that the present invention is not limited to the above embodiments, that may be modified and changed without departing from the scope and spirit of the invention.

What is claimed is:

1. An etching apparatus selectively etching a peripheral portion of a wafer, comprising:
   a stage on which said wafer is placed;
   an etchant supply port allowing through which an etchant etching said peripheral portion is supplied;
   an etching-interfering agent supply port through which an etching-interfering agent interfering supply of said etchant to said center of said wafer is supplied;
   a movable alignment mechanism taking part in wafer alignment on said stage, the alignment mechanism being configured to equalize a width of removal of the peripheral portion of the wafer;
   a peripheral removal width observation unit observing the width of removal of said peripheral portion of said wafer after the etching, the peripheral removal width observation unit being configured to discriminate an etched peripheral region from an other region;
   an output unit outputting said width of removal of said peripheral portion of said wafer observed by said peripheral removal width observation unit; and
   a control unit controlling a stroke of said alignment mechanism, based on displacement of the wafer in a previous processing and based on said width of removal of said peripheral portion of said wafer output by said output unit,
   wherein said peripheral removal width observation unit includes an optical microscope configured to discriminate the etched peripheral region from the other region based on a contrast therebetween, and
   wherein said control unit calculates a displacement of a center of said wafer, based on said width of removal of said peripheral portion of said wafer observed by said peripheral removal width observation unit, and controls said stroke of said alignment mechanism based on said displacement of said center of said wafer.

2. The etching apparatus according to claim 1, further comprising an upper electrode and a lower electrode generating a plasma, wherein
   said stage is configured as placing said wafer between said upper electrode and said lower electrode, and as having an in-plane width smaller than that of said wafer placed thereon.

3. The etching apparatus according to claim 1, wherein said alignment mechanism is configured as being independently movable towards a plurality of directions.

4. The etching apparatus according to claim 3, wherein said alignment mechanism is configured as being movable in said transverse direction with respect to said stage.

5. The etching apparatus according to claim 3, wherein said alignment mechanism includes a pin provided in said stage, a pin moving mechanism moving said pin in said transverse direction with respect to said stage, a monitor unit monitoring a current position of said wafer, and a positional control unit controlling position of said pin moving mechanism based on said wafer position monitored by said monitor unit.

6. The etching apparatus according to claim 1, wherein said alignment mechanism is configured as being movable in said transverse direction with respect to said stage.

7. The etching apparatus according to claim 1, wherein said alignment mechanism aligns said wafer by moving said guard block by a predetermined stroke.

8. The etching apparatus according to claim 1, wherein said sub-mechanisms are independently movable in different directions.

9. The etching apparatus according to claim 1, wherein said alignment mechanism includes a pin provided in said stage, a pin moving mechanism moving said pin in said transverse direction with respect to said stage, a monitor unit monitoring a current position of said wafer, and a positional control unit controlling position of said pin moving mechanism based on said wafer position monitored by said monitor unit.

10. The etching apparatus according to claim 1, wherein at least either of said etchant supply port and said etching-interfering agent supply port is provided in a multiple way, so as to supply said material-to-be-supplied through said plurality of supply ports in a plurality of directions, and so as to independently control supply volume of said gas from said plurality of supply ports.

11. The etching apparatus according to claim 10, further comprising a partition plate partitioning said material-to-besupplied supplied from said plurality of etchant supply ports or said etching-interfering agent supply ports.

12. The etching apparatus according to claim 10, wherein the control unit independently controls said supply volume of said material-to-be-supplied supplied through said plurality of etchant supply ports or said etching-interfering agent supply ports, based on said width of removal of said peripheral portion of said wafer output by said output unit.

13. The etching apparatus according to claim 1, wherein said etching-interfering agent supply port is provided in a multiple way so as to supply said etching-interfering agent in a plurality of directions, and said etching apparatus further comprising a supply volume control unit independently controlling said supply volume of said etching-interfering agent through said plurality of etching-interfering agent supply ports.

14. The etching apparatus according to claim 1, wherein both of said etchant supply ports and said etching-interfering agent supply ports are provided in multiple ways, so as to supply said etchant supplied through said plurality of etchant supply ports and said etching-interfering agent supplied through said plurality of etching-interfering agent supply ports are respectively supplied in a plurality of directions, and so as to independently control supply volumes of said etching-interfering agent supplied through said plurality of etching-interfering agent supply ports and said etchant supplied through said plurality of etchant supply ports.

15. The etching apparatus according to claim 1, wherein said movable alignment mechanism is provided in a wafer processing apparatus where said stage is placed.

16. The etching apparatus according to claim 1, wherein said movable alignment mechanism includes a plurality of sub-mechanisms each comprising a drive unit provided beside said stage, an arm extendable in a transverse direction, and a guard block held by said arm and configured to be directly contactable with said wafer.

17. The etching apparatus according to claim 1, wherein said control unit is configured to calculate displacement of a center of the wafer based upon the width of removal of the peripheral portion observed by the peripheral removal width observation unit.

18. The etching apparatus according to claim 1, wherein said control unit is configured to compare a width of removal of the peripheral portion of the wafer obtained from the peripheral removal width observation unit with a reference value stored in the control unit, and judges whether the wafer was appropriately etched.

19. An etching apparatus selectively etching a peripheral portion of a wafer, comprising:

a stage on which said wafer is placed;

an etchant supply port allowing through which an etchant etching said peripheral portion is supplied;

an etching-interfering agent supply port through which an etching-interfering agent interfering supply of said etchant to said center of said wafer is supplied;

a movable alignment mechanism taking part in wafer alignment on said stage, the alignment mechanism being configured to equalize a width of removal of the peripheral portion of the wafer;

a peripheral removal width observation unit observing the width of removal of said peripheral portion of said wafer after the etching, the peripheral removal width observation unit being configured to discriminate an etched peripheral region from an other region;

an output unit outputting said width of removal of said peripheral portion of said wafer observed by said peripheral removal width observation unit; and a control unit controlling a stroke of said alignment mechanism, based on displacement of the wafer in a previous processing and based on said width of removal of said peripheral portion of said wafer output by said output unit, wherein said peripheral removal width observation unit includes a step profiler or a film thickness profiler configured to discriminate the etched peripheral region from the other region based on a difference in film thickness, and wherein said control unit calculates a displacement of a center of said wafer, based on said width of removal of said peripheral portion of said wafer observed by said peripheral removal width observation unit, and controls said stroke of said alignment mechanism based on said displacement of said center of said wafer.

* * * * *